(12) United States Patent
Kydd et al.

(10) Patent No.: US 6,379,745 B1
(45) Date of Patent: *Apr. 30, 2002

(54) LOW TEMPERATURE METHOD AND COMPOSITIONS FOR PRODUCING ELECTRICAL CONDUCTORS

(75) Inventors: Paul H. Kydd, Lawrenceville, NJ (US); Gregory A. Jablonski, Yardley, PA (US); David L. Richard, Fanwood, NJ (US)

(73) Assignee: Parelec, Inc., Rocky Hill, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/367,783
(22) PCT Filed: Sep. 12, 1997
(86) PCT No.: PCT/US97/16226
 § 371 Date: Aug. 20, 1999
 § 102(e) Date: Aug. 20, 1999
(87) PCT Pub. No.: WO98/37133
 PCT Pub. Date: Aug. 27, 1998

Related U.S. Application Data

(60) Provisional application No. 60/038,669, filed on Feb. 20, 1997, provisional application No. 60/038,514, filed on Feb. 20, 1997, and provisional application No. 60/038,670, filed on Feb. 20, 1997.

(51) Int. Cl.[7] .............................. B05D 5/12; G03G 9/12; C08K 3/08
(52) U.S. Cl. .................. 427/96; 427/229; 427/261; 427/287; 106/1.18; 106/1.21; 430/119; 430/126
(58) Field of Search .................. 427/96, 123, 125, 427/229, 261, 283, 287, 383.1; 252/512, 513, 514, 519.3, 520.3, 521.3; 430/119, 126; 106/1.18, 1.21

(56) References Cited

U.S. PATENT DOCUMENTS

| | | | | |
|---|---|---|---|---|
| 4,289,534 A | * | 9/1981 | Deffeyes et al. | |
| 4,808,274 A | | 2/1989 | Nguyen | 204/15 |
| 4,891,242 A | | 1/1990 | Ito et al. | 427/53.1 |
| 5,059,242 A | | 10/1991 | Firmstone et al. | 106/1.23 |
| 5,139,818 A | * | 8/1992 | Mance | |
| 6,143,356 A | * | 11/2000 | Jablonski | |

* cited by examiner

Primary Examiner—Fred J. Parker
(74) Attorney, Agent, or Firm—Woodbridge & Associates, PC; Stuart H. Nissim; Richard C. Woodbridge

(57) ABSTRACT

A composition of matter having a metal powder or powders of specified characteristics in a Reactive Organic Medium (TOM). These compositions can be applied by any convenient printing process to produce patterns of electrical conductors on temperature-sensitive electronic substrates. The patterns can be thermally cured in seconds to form pure metal conductors at a temperature low enough to avoid damaging the substrate.

15 Claims, 11 Drawing Sheets

DEVELOP RESIST

PRINT PARMOD

PLACE COMPONENTS

OVEN TREAT

MAKE CIRCUIT → PRINT CROSS OVER → OVEN TREAT → ADD SOLDER MASK

PRINT CROSS OVER AND PADS — PLACE COMPONENTS → OVEN TREAT

DEVELOP RESIST — PRINT PARMOD — PLACE COMPONENTS — OVEN TREAT

THICK FILM ON POLYMER ALTERNATIVES

|  |  | ELECTRICAL RESISTIVITY MICROOHM-cm | TEMPERATURE C | CURE TIME MINUTES |
|---|---|---|---|---|
|  | CARBON-EPOXY | >500 | 150 | 30-90 |
|  | SILVER-EPOXY | >50 | 150 | 30-90 |
|  | TRANSIENT LIQUID PHASE | 30-40 | 220 | >10 |
|  | PARMOD | <6 | 220-360 | <3 |
|  | CONVENTIONAL THICK FILM | <6 | 500-850 | >10 |

LOW TEMPERATURE METHOD AND COMPOSITIONS FOR PRODUCING ELECTRICAL CONDUCTORS

This application is a 371 of PCT/US 97/16226 filed Sep. 12, 1997 which claims benefit of Prov. Nos. 60/038,669, 60/038,514 and 60/038,670 all filed on Feb. 20, 1997.

BACKGROUND OF THE INVENTION

1. Field of the Invention

The present invention relates to compositions which can be used to apply conductors to electronic components such as printed circuit boards and semiconductors, particularly, to compositions which can be applied and converted to solid conductors at temperatures below 450° C.

2. Related Art

A common method for printed circuit fabrication process is subtractive or semi-additive processes in which conductors are formed by etching away unwanted copper. A fully additive process would have many advantages over the subtractive or semi-additive methods. The primary problem in providing a wholly additive process for producing printed circuitry is the requirement for high electrical conductivity with low enough curing temperature to be compatible with the polymer-based circuit boards. Another major problem is making connections to the additive traces, preferably by conventional soldering. Present technology includes low cure temperature conductive epoxies and transient liquid phase materials which produce traces with poor electrical conductivity and poor solderability or high temperature thick film inks which produce traces with good electrical conductivity and good solderability but which are limited to ceramic substrates. These small, expensive and specialized substrates are required to withstand the thick film ink firing temperatures of more than 650° C. and usually above 850° C. A method which could duplicate the performance of thick film inks but on polymer-based substrates at 250 to 350° C. would permit application of this technology broadly in the $27 billion rigid circuit board industry and the $2.5 billion flexible circuit industry, worldwide.

"Thick film" technology is routinely practiced to produce hybrid circuits on ceramic substrates. R. W. Vest, "Electronic Ceramics", R. Breckenridge, ed., 1991. The conductor patterns are created by silk screening or stencil printing thick film pastes or inks onto ceramic substrates and firing them at temperatures of 850 to 1100° C. to reduce the metal-containing inks to metal. An example of such inks are silver-palladium compositions which have recently been reviewed by Wang, Dougherty, Huebner and Pepin, J. Am. Ceram. Soc. 77(12), 3051–72 (1994). Typically thick film inks contain metal powders, an inorganic glass binder and a vehicle consisting of. a polymer binder and a solvent. The vehicle provides the correct consistency for screen printing and consists typically of a polymer such as ethyl cellulose, hydrogenated rosin or polyacrylics dissolved in a low volatility solvent. Common solvents are terpineol, dibutyl carbitol and various glycol ethers and esters. The inks are applied to ceramic substrates by screen printing, dried to drive off the solvent and heat treated, usually in a belt furnace, to decompose the polymer binder and fuse the metal and the inorganic glass binder. The glass phase provides the bond to the substrate which is usually alumina, and the metal provides the electrical conductivity. Typically the conductors have a striated cross section with layers of glass alternating with layers of metal. The glass tends to concentrate at the ceramic interface and the metal at the air interface. The conductivity is typically one half to one quarter that of the bulk metal.

A number of thick film compositions contain surfactants to improve screenability and stability of the metal powder dispersions. Often these surfactants are metallo-organic compounds such as soaps of carboxylic acids. These are convenient in that they will decompose at relatively low temperature to deposit the metal or its oxide which can perform a useful function in the fired conductor.

U.S. Pat. No. 5,071,826 issued on Dec. 10, 1991 and U.S. Pat. No. 5,338,507 issued on Aug. 16, 1994 to J. T. Anderson, V. K. Nagesdh and R. C. Ruby, disclose the addition of silver neodecanoate to superconducting oxide mixtures in which the neodecanoate is decomposed to the metal at 300° C. to coat the superconducting grains with silver. The coated grains are then sintered and oxidized at 600–800° C. to produce an oxide superconductor of enhanced strength and critical current.

The addition of titanate to thick film conductors by decomposition of an organo-metallic titanate is described by K. M. Nair in U.S. Pat. No. 4,381,945 issued on May 3, 1983.

U.S. Pat. No. 4,599,277 issued on Jul. 8, 1986 to J. M. Brownlow which discloses adding organo-metallic compounds to thick film inks to increase the densification temperature of the metal to match that of the ceramic substrate at 850–950° C., the inverse of the process required to apply conductors to polymer circuits at low temperatures.

Conventional thick film paste compositions containing silver flake, glass flit and silver resinates, which are carboxylic acid soaps, as well as surfactants such as Triton X 100, were described in U.S. Pat. No. 5,075,262, issued on Dec. 24, 1991 and U.S. Pat. No. 5, 183,784, issued on Feb. 2, 1993 to M. N. Nguyen and coworkers. The objective was to eliminate the preliminary drying step after printing, and the resinate was said to promote adhesion and minimize cracks and voids in bonding semiconductor dies to a ceramic substrate at 350–450° C.

V. K. Nagesh and R. M. Fulrath were issued U.S. Pat. No. 4,130,671 on Dec. 19, 1978 which was assigned to U.S. Department of Energy. It discloses a similar composition of glass frit and silver resinate which was decomposed at low temperature to provide silver-coated glass particles similar to the superconductor of Anderson above. The particles were applied to a substrate either before or after decomposition of the resinate and fired in an oxidizing atmosphere at 500 to 700° C. to provide a conductor of metal-coated glass particles.

Still other conventional thick film compositions of glass and metal powders in an organic vehicle but without the resinate are described in U.S. Pat. Nos. 5, 250,229 and 5,378,408.

To create a low temperature analog of the thick film process, it will be necessary to find a new mechanism to obtain adhesion and cohesion of the deposited metal which can operate at temperatures below 450° C., which is the extreme upper temperature limit that most polymers can tolerate. The use of inorganic glass powder binders which are universally used in conventional thick film inks is not possible in this application because none of them melt a low enough temperature, and the glass will not bond to the metal or to the polymer substrates.

Other approaches to this objective have been described. The most common one is the creation of electrically conductive inks or pastes by incorporating metal powder, usually silver powder, in an organic matrix, the so-called "Polymer Thick Film" materials. This is a major industry with products available from Ablestik, AIT, Hokurika, M-Tech, Thermoset, Epoxy Technology and Ferro, among others. These materials can be printed on circuit boards, and they have good adhesion. An example of the application of this technology was described in an article by K. Dreyfack in Electronics 52(17), 2E–4E, 1979, on Societie des Produits Industrielles ITT's silk screening silver and graphite-based conductors of this type onto rigid and flexible circuits. One problem with this approach is that the inks conduct by random contacts between powder grains in the organic matrix, and the conductivity is poor. Typical values of the resistivity, which is the reciprocal of conductivity, are 40 to 60 microohm cm, compared to bulk silver at 1.59 microohm cm and high temperature thick film conductors at 3–6 microohm cm. Still more disturbing is the fact that the electrical conductivity is not constant with time. The conductivity depends on adventitious contacts between individual metal grains which are prone to be made and broken randomly as the trace is heated and cooled and particularly as it is exposed to moisture and other environmental influences. Another major problem with polymer thick film materials is that because of their organic content, they are not solderable.

A typical resin-bonded copper powder conductor is described in Japanese Patent Application 52-68507, June, 1977. U.S. Pat. No. 4,775,439 issued on Oct. 4, 1988 to R. E. Seeger and N. H. Morgan, describes a more elaborate polymer thick film approach. In this concept metal powder and binder are applied to a substrate and dried. The trace is then covered by a polymer film which is adhesively laminated to the substrate to hold the conductor in place. This does not address the problem of obtaining electrical conductivity comparable to bulk metal.

Bulk conductivity has been achieved at low temperature by decomposing metallo-organic compounds on various substrates. They can be applied by ink jet printing as described by R. W. Vest, E. P. Tweedell and R. C. Buchanan, Int. J. of Hybrid Microelectronics 6, 261–267, 1983. Vest et al have investigated so-called MOD (Metallo-Organic Decomposition) technology over many years. The most relevant aspect of this research was reviewed in "Liquid Ink Jet Printing with MOD Inks for Hybrid Microcircuits" Teng, K. F., and Vest, R. W., IEEE Transactions on Components, Hybrids and Manufacturing Technology, 12(4), 545–549, 1987. The authors described their work on printing silver and gold conductors as well as dielectrics and resistors. MOD compounds are pure synthetic metallo-organic compounds which decompose cleanly at low temperature to precipitate the metal as the metallic element or the oxide, depending on the metal and the atmosphere. The noble metals, silver, gold and the platinum group decompose to metal films in air. The organic moiety is bonded to the metal through a hetero-atom providing a weak link that provides for easy decomposition at low temperature. An oxygen bond, as in carboxylic acid-metal soaps, has been found to be satisfactory, as have amine bonds for gold and platinum.

Vest et al investigated metallization of ceramic substrates and silicon by ink jet printing of xylene solutions of soaps such as silver neodecanoate and gold amine 2-ethylhexanoate. Images of satisfactory resolution (0.003 inches or 75 microns) were obtained, but the conductivity was low because of the extremely small thickness of the layers after decomposition which was less than a micron. Preliminary experiments by Partnerships Limited on epoxy-glass circuit boards with silver neodecanoate solutions demonstrated that well-bonded conductors could be produced on polymer substrates. Again, the difficulty was that they were very thin and had inadequate conductivity. It was found that the addition of more MOD compound resulted in wider traces but not thicker ones. The MOD compound melts before decomposing and spreads over the surface uncontrollably. Since melting provides for a well-consolidated metal deposit after decomposition, which is desirable, and since some MOD compounds are actually liquids at room temperature, this is an unavoidable problem. A possible solution to this problem is to build up the thickness by printing many layers, which Vest et al found suitable for metallizing silicon solar cells, but this detracts from the single pass production of circuits, which is our objective.

Similar materials and techniques have been used to apply thin film metallization and seed coatings which are then built up with solder or electroplating. U.S. Pat. No. 4,650,108, issued on Mar. 17, 1987, to B. D. Gallegher and assigned to the National Aeronautics and Space Administration, Washington, D.C.; U.S. Pat. No. 4,808,274 issued on Feb. 28, 1989, to P. H. Nguyen; U.S. Pat. No. 5,059,242 issued on Oct. 22, 1991 to M. G. Firmstone and A. Lindley and U.S. Pat. No. 5,173,330 issued on Dec. 22, 1992, to T. Asano, S. Mizuguchi and T. Isikawa, are examples. Thin films alone cannot provide adequate conductivity.

A creative attempt to circumvent the resistivity problem was described in U.S. Pat. No. 4,487,811 issued on Dec. 11, 1984, to C.W. Eichelberger. The patent describes augmenting the conductivity by a replacement reaction of metal in the deposit by a more noble metal in solution, for example the replacement of iron by copper. In the process of doing this, the contact between particles is improved by the greater volume of the replacement metal and its greater intrinsic conductivity. A resistivity of 7.5 microohm cm was achieved, substantially better than silver-loaded epoxies, but short of the performance of thick film inks.

The replacement reaction solved yet another problem of polymer inks in that the material was solderable, which conductive epoxy formulations in general are not. Another approach to solderability was described in U.S. Pat. No. 4,548,879 issued on Oct. 22, 1985 to F. St. John and W. Martin. Nickel powder was coated with saturated monocarboxylic acid with ten or more carbon atoms. The coated powder was mixed with novolac epoxy resins in a butyl carbitol acetate vehicle and silk screened onto an epoxy-glass board. After curing at 165° C., the conductive trace could be solder-coated by fluxing and dipping into molten solder, while a trace made with uncoated nickel powder could not be soldered. No improvement in electrical conductivity was described with this process.

A silver powder is disclosed in "Novel Silver Powder Composition", U.S. Pat. No. 4,186,244 issued Jan. 29, 1980, and "Process for Forming Novel Silver Powder Composition", U.S. Pat. No. 4,463,030 issued Jul., 31, 1984, Both issued to R. J. Deffeyes, and H. W. Armstrong and assigned to Graham Magnetics, Inc. North Richland Hills, Tex. The silver powder was formed by decomposing dry silver oxalate in the presence of a long chain carboxylic acid, either saturated (stearic acid, palmitic acid) or unsaturated (oleic acid, linoleic acid). The acid reacted with the metal powder as it was formed to provide a protective coating on the surface and to limit the particles to sub-micron size. The particles were washed to remove excess acid and blended with an equal weight of a conventional thick film vehicle consisting of ethyl cellulose polymer binder and pine oil solvent.

The resulting ink was coated on a ceramic or polyimide substrate and heated to 250° C. in air for 30–90 seconds to convert the coated powder to a silver conductor with a stated conductivity of one ohm per square, which is not adequate for practical circuitry with traces many hundreds or thousands of squares long. The coating is said to be solderable without flux, which is believable if residual acid is acting as a flux. It is stated to be resistant to leaching in a bath of molten solder, which is unexpected, based on the well known solubility of silver in solder.

A somewhat similar silver flake material was patented by Grundy of Johnson and Matthey, U.S. Pat. No. 4,859,241, Aug. 22, 1989. The flake was prepared by milling silver powder with silver stearate surfactant in an organic solvent to produce silver stearate-coated silver flakes providing a glass-filled ink composition of superior stability. This is a common method of preparing stable powders and flakes of silver.

Another class of materials used to produce additive electronic circuitry are the Transient Liquid Phase materials developed by Toronaga Technologies under the trade name "Ormet". These materials and their applications are described by P. Gandhi Circuit World 23 (1), October, 1996, p. 43–46, and Roberts, E.; Proceedings of NEPCON WEST '96, 3, 1748–1752, 1996. The materials consist of a mixture of powdered silver or copper conductor with powdered solder and a polymer binder. They can be printed like conductive epoxies but when heated, the solder melts and alloys with the conductor creating a network of fused metal. Further heating at temperatures in the neighborhood of 220° C. for 10 minutes cures the polymer binder which provides for adhesion of the conductor to the polymer substrate. An alternative is to provide an adhesive layer on the substrate as disclosed by M. A Capote and M. G. Todd of Toranaga Technologies in U.S. Pat. No. 5,538,789, Jul. 23, 1996 and U.S. Pat. No. 5,565,267, Oct. 15, 1996.

Typically Ormet compositions yield electrical resistivities in the range 20–30 microohm-cm. there is also an issue with solderability because of the presence of the polymer binder.

None of the materials or mixtures described above accomplish the goal of providing a composition which can be cured to a well-bonded, well-consolidated metallic conductor with an electrical conductivity comparable to conventional thick film inks but with a curing temperature below 350° C., preferably below 300° C., more preferably below 275 C., which is required for compatibility with conventional polymer-based circuit board substrates. None of these materials has made it possible to impact the circuit board industry with new technology for rapid production by a simple process with no hazardous waste production. A new approach to provide this low temperature capability is needed.

SUMMARY OF THE INVENTION

The present invention provides printable compositions and processes for applying them to temperature-sensitive substrates and curing them to traces of high electrical conductivity at temperatures which the substrates can withstand. The essential constituents of these compositions are 1) a metal powder mixture of specified characteristics and 2) a Reactive Organic Medium (ROM) in which the consolidation of the metal powder mixture to a solid conductor takes place.

The metal powder mixture is comprised of a mixture of at least two type of metal powders: 1) metal flakes with a preferred major diameter of approximately 5 micrometers and a thickness-to-diameter ratio of 10 or more and 2) colloidal or semi-colloidal metal powders with mean diameters less than about 100 nanometers which are not aggregated to any great degree.

The ROM can consist of any metallo-organic compound which is readily decomposable to the corresponding metal, or an organic compound which can react with the metal to produce such a compound. Examples are metal soaps and the corresponding fatty acids. Other examples are metal amines and metal mercapto compounds and their corresponding amino and sulfide precursors.

The constituents of these compositions are weighed out in appropriate proportions, mixed with additional surfactants or viscosity modifiers if needed to provide the proper consistency, and milled together as on a three roll mill to provide a homogeneous, printable composition.

The composition is printed on the substrate using any convenient printing technology. Screen printing and stenciling are suitable for rigid substrates in relatively small numbers with high resolution. Gravure printing, impression printing and offset printing are suitable for high production rates on flexible substrates. Ink jet printing and electrostatic printing offer the additional advantage of direct computer control of the printed image. This permits circuits to be printed directly from Computer Aided Design (CAD) files and eliminates the need for special tooling. Each circuit can be different, if desired, for coding or prototyping. The same end can be achieved at lower production rates with computer-controlled dispensing equipment. This equipment produces dots or lines by moving a needle over the surface and dispensing printing composition supplied by a pump or pressurized syringe.

Substrates to which these compositions can be applied include rigid, glass-reinforced epoxy laminates, polyimide films for flexible circuits, other polymer-based electronic components, metal pads and semiconductor components. The compositions adhere naturally to most epoxy surfaces. Good adhesion to polyimide films requires the presence of a coating. FEP TEFLON® and low glass transition point polyimide coatings have been found to be satisfactory.

Adhesion to metals requires a clean metal surface, similar to the requirements for soldering. Acid constituents in the ROM act as fluxes to promote adhesion. Plating or tinning the metal pads is also effective. The use of organic solder protectants on copper pads is effective. Adhesion to semiconductors requires metallization with which the compositions are compatible.

The compositions are cured by exposure to heat for a short period of time. This time varies with the temperature to which the substrate can safely be exposed, but is less than a minute to achieve most of the electrical conductivity of which the composition is capable, and in some cases is less than 10 seconds at temperature.

Silver and gold may be cured in air. Copper and other non-noble metals require a protective atmosphere. Nitrogen with less than about 3 parts per million of oxygen has been found suitable for processing copper compositions. Addition of water vapor during the curing process, but not before or after, has been found to be beneficial in curing copper compositions.

The compositions of the present invention can be selectively applied only where conductors are required on a temperature-sensitive substrate by any convenient printing technology. These include screen printing, stenciling, gravure printing, impression printing, offset printing, ink jet printing and electrostatic printing and copying. Unexpectedly, it has been found that when heated, these compositions cure in seconds to well-consolidated, well-bonded conductive traces of pure metals at temperatures hundreds of degrees lower than required for conventional metallurgical sintering processes. This provides a wholly new capability to create printed circuitry at higher speed and lower cost than with conventional technology. The hazardous waste production characteristic of conventional photolithography, plating and etching processes is completely eliminated.

BRIEF DESCRIPTION OF THE DRAWINGS

Preferred embodiments according to the present invention will be described in detail with reference to the following figures, wherein.

DETAILED DESCRIPTION OF THE INVENTION

Compositions of the present invention are comprised of a metal powder mixture and a Reactive Organic Medium (ROM). These compositions can be applied to temperature-sensitive substrates and cured to well-consolidated, well-bonded circuit traces by heat treatment at a temperature which does not damage the substrate. The compositions of the present invention exhibit a critical temperature above which they undergo a transformation to well-consolidated electrical conductors with a resistivity only two or three times the bulk resistivity of the metal in question. The electrical conductivity is equal to that obtained by conventional high temperature metal powder sintering in conventional thick film compositions on ceramic substrates. Remarkably, this consolidation process takes place at temperatures 400 to 500 degrees Celsius lower than those conventionally used in thick film technology, and in times which are an order of magnitude shorter than are required for sintering.

Suitable metals include copper, silver, gold, zinc, cadmium, palladium, iridium, ruthenium, osmium, rhodium, platinum, iron, cobalt, nickel, indium, tin, antimony, lead, bismuth and mixtures thereof. In a preferred embodiment, the metal powder mixture contains metal flake and colloidal or semi-colloidal metal powder where the composition contains about 70 to 80% by weight of the metal powder mixture.

Figure 1A:
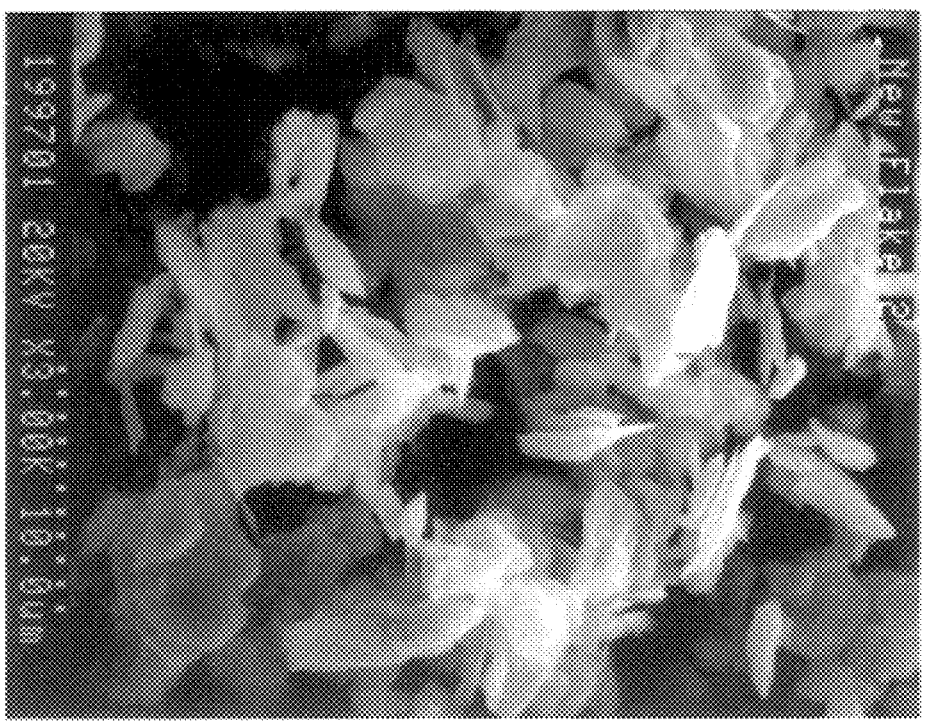
FIG. 1a is a Scanning Electron Micrograph (SEM) of copper flake as used in the present invention.
Figure 1B:
FIG. 1b is an SEM of silver flake as used in the present invention.

The metal flakes have a major dimension between 2 to 10 micrometers, preferably about 5 micrometers, and a thickness of less than 1 micrometer. They can be produced by techniques well known in the art by milling the corresponding metal powder with a lubricant, which is frequently a fatty acid or fatty acid soap. The starting powders are usually produced by chemical precipitation to obtain the desired particle size and degree of purity. The flakes are sold for electronic applications as constituents of thick film inks and silver-loaded conductive epoxies, as mentioned above. FIGS. 1a and 1b show Scanning Electron Micrographs of copper and silver flakes, respectively, which are used.

In the compositions of the present invention, the flakes perform several functions. They form a skeleton structure in the printed image which holds the other ingredients together and prevents loss of resolution when the mixture is heated to cure it. The flakes naturally assume a lamellar structure like a stone wall which provides electrical conductivity in the direction parallel to the surface of the substrate and provides a framework to lessen the amount of metal transport necessary to achieve the well-consolidated pure metal conductors which are the objective of this invention. They also provide low surface energy, flat surfaces to which the other constituents of the composition can bond and on which metal can be deposited.

The other metallic powder mixture constituent of the present invention are colloidal or semi-colloidal powders with diameters below 100 nanometers. The colloidal or semi-colloidal powder is preferably present in about 40% by weight of the total weight of the metal powder mixture. A primary function of these powders is to lower the temperature at which the compositions will consolidate to nearly solid pure metal conductors. The presence of fine metal powder has been found to be helpful in advancing this low temperature process with silver and essential to the consolidation of copper mixtures.

Figure 2A:
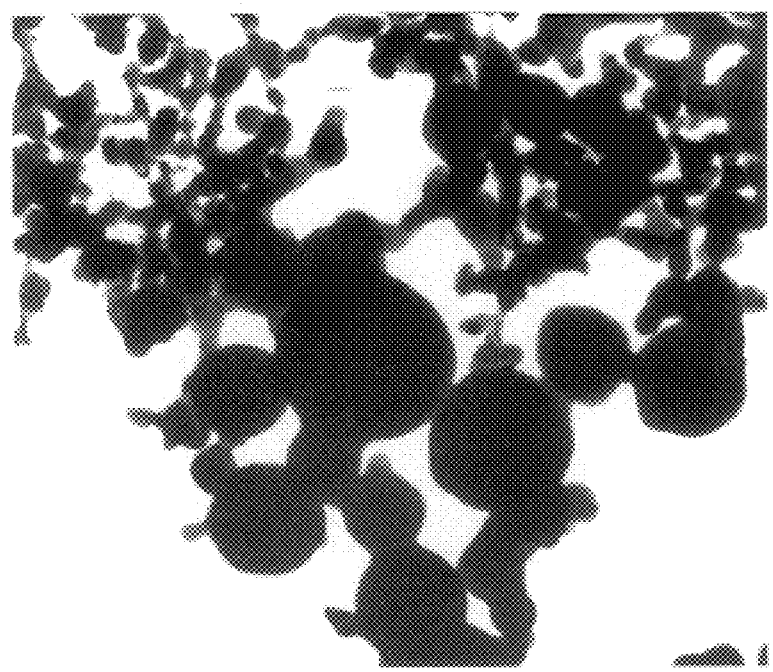
FIG. 2a is a Transmission Electron Micrograph (TEM) of agglomerated copper powder not suitable for the present invention.

It is important that they be present as individual particles. Metal particles this small have a strong tendency to agglomerate into aggregates with an open skeletal structure as shown in FIG. 2a. This is a copper powder produced by evaporating copper metal into inert gas where it condensed into particles of the desired size. In this case, however, the individual particles were totally agglomerated into large aggregates with a rigid skeletal structure which prevented consolidation of the mixtures made with the powder.

Figure 2B:
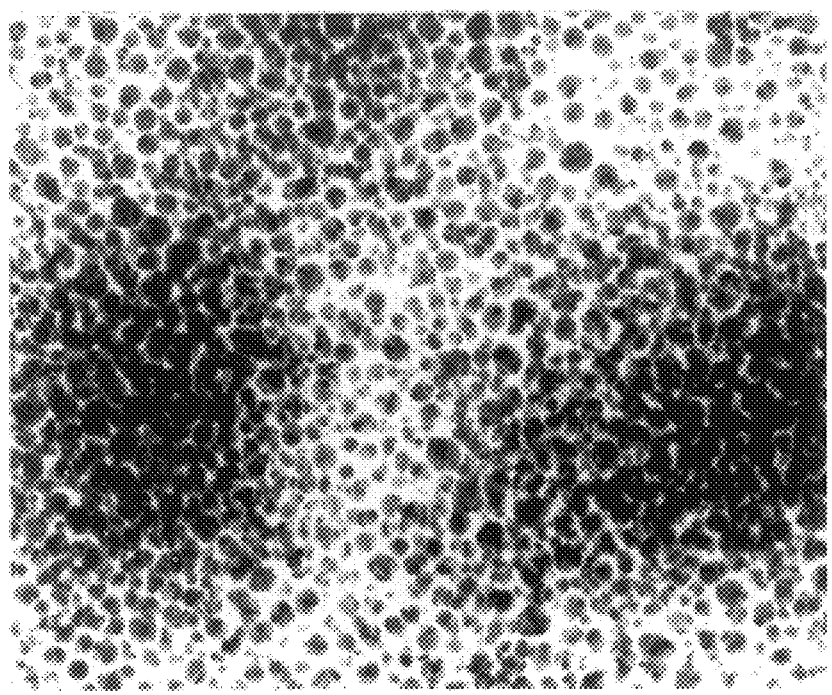
FIG. 2b is a TEM of colloidal silver powder as used in the present invention

FIG. 2b shows a TEM of colloidal silver particles with a nominal diameter of 20 nanometers in an excellent state of dispersion. This material has been used in silver compositions and has lowered the critical consolidation temperature from 300 to 260 degrees C. These results and similar results with various copper powders are shown in Table 1.

TABLE 1

Electrical Resistivity and Adhesion as a Function of Copper Powder Size Treated at 355° C. for 3 minutes

| Powder | Size | Resistivity | Tape test |
| --- | --- | --- | --- |
| Flake only | 5 × 1 micrometer | 24 | poor |
| Powder 1 | 0.5 micrometer agglomerated | 7 | good |
| Powder 2 | 0.2 micrometer agglomerated | 5 | good |
| Powder 3 | <0.1 micrometer | 4.6 | good |

To achieve and preserve the desired degree of dispersion of colloidal metal it is essential to stabilize the particles so that they cannot aggregate. In the case of the silver particles they were stabilized by the presence of a surfactant which coated the surface of the particles and prevented metal-to-metal contact. This favors chemical precipitation as a means of producing the powders, since they can be exposed to an environment which promotes stabilization from formation to final consolidation.

The Reactive Organic Medium (ROM) provides the environment in which the metal powder mixture is bonded together to form well-consolidated conductors. Many classes of organic compounds can function as the ROM. The common characteristic which they share and which renders them effective is that they have, or can form, a bond to the metal via a hetero-atom. The hetero-atoms can be oxygen, nitrogen, sulfur, phosphorous, arsenic, selenium and other nonmetallic elements, preferably oxygen, nitrogen or sulfur. This bond is weaker than the bonds holding the organic moiety together, and can be thermally broken to deposit the metal. In most cases the reaction is reversible, so that the acid or other organic residue can react with metal to reform the metallo-organic compound, as shown schematically below:

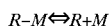

where R is a reactive organic compound and M is the metal.

Examples of such compounds are soaps of carboxylic acids, in which the hetero-atom is oxygen; amino compounds, in which the hetero-atom is nitrogen; and mercapto compounds, in which the hetero-atom is sulfur.

Specific examples of preferred ROM constituents are the carboxylic acids and the corresponding metallic soaps of neodecanoic acid and 2-ethyl hexanoic acid with silver and copper, such as silver neodecanoate illustrated by the formula:

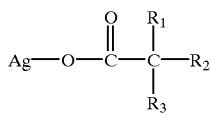

where $R_1$, $R_2$, and $R_3$ are $C_9H_{19}$ and silver 2-ethyl hexanoate as illustrated by the formula:

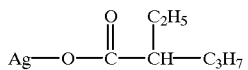

Gold amine 2-ethyl hexanoate is an example of a nitrogen compound.:

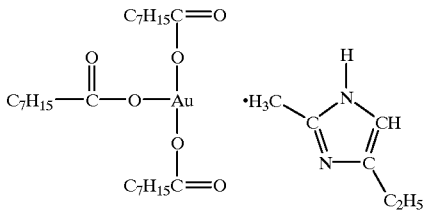

Gold amine 2-ethyl hexanoate (gold amine octoate)

Gold t-dodecyl mercaptide is an example of a sulfur compound:

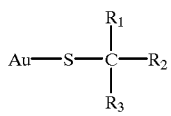

where $R_1$, $R_2$, and $R_3$ are $C_{11}H_{23}$

These ROM compositions can be made by methods well known in the art. All of the above compounds are capable of decomposition to the respective metals at relatively low temperatures. For the silver neodecanoate and silver 2-ethyl hexanoate (silver octoate), the decomposition temperature is between 200 and 250° C. For the corresponding copper compounds, it is between 300 and 315 C. Gold sulfides decompose at very low temperatures in the neighborhood of 150° C. Gold amine octoate decomposes between 300 and 500° C. The copper and silver compounds can be reformed from the corresponding acids at the same temperature, so the reaction is reversible, as mentioned above.

In some cases it is convenient to add rheology-enhancing compounds well known in the art to improve the printing characteristics of the compositions of the invention. Alpha-terpineol has been used to reduce the viscosity of copper and silver compositions to facilitate screen printing. Alpha-terpineol also participates in the consolidation reaction by virtue of the acid character of the OH group bonded to an unsaturated ring. By selecting constituents and additives, it has proven possible to produce a range of printable compositions ranging from fluid inks with a viscosity of 15 centipoise to solid powders.

Compositions of this invention have been applied by screening, stenciling, gravure printing, dispensing, ink jet printing and by coating an adhesive pattern with a dry powder composition or toner. Screening, as used in applying conventional thick film pastes has been used most extensively for preparing samples for evaluation. A composition with a viscosity of approximately 500 poise is forced through a fine screen with a photo-defined open image of the desired conductor pattern in it by a rubber squeegee. The resolution which has been achieved by this method is approximately 125 micron (5 mil) lines and spaces, although production screen printers can achieve patterns as fine as 50 microns. Conductive traces with thicknesses up to 50 microns have been printed, though most of the test patterns have been in the neighborhood of 12 microns thick, which is equivalent to 0.37 ounces of copper per square foot.

Substrates

Preferred substrates include polymer-based substrates such as FR-4 glass reinforced epoxy laminate and coated polyimide films for silver compositions. Copper compositions, because of their higher curing temperature, are limited to the coated polyimides. Tested compounds would not adhere to bare polyimide films, although films treated in an oxygen plasma show some improvement. The reason is that adhesion is dependent on the chemical nature of the surface and some form of organic adhesive is necessary for good adhesion. This can be inherent in the chemistry of the surface as it appears to be in many epoxies. The silver compositions of this invention will adhere powerfully to FR-4 surfaces, even though the epoxy has been cured in the original lamination process. It is possible to apply the materials of his invention to one side of the laminate, oven cure it, apply another pattern to the other side, and cure again with no appreciable decrease in the adhesion achievable on the second side.

The organic adhesive can be either thermoplastic or thermosetting. DuPont Kapton® FN which has been extensively used in developing the present compositions has a coating of FEP Teflon® on the surface which melts and bonds to the metal traces deposited by the present process. Kapton® KJ films have a surface coating of low glass transition point polyimide which can be softened to bond the present compositions in the temperature range of 220 to 350° C. Polyamic acid coatings can be metallized with these compositions and cured to polyimide dielectric which insulates and bonds the conductors thus formed. Photoimageable epoxy-acrylate surfaces provide excellent adhesion after curing.

Silver compositions containing only the metallo organic decomposition compound will adhere to silver plated or tinned copper surfaces or to those protected by an organic solder protectant such as benzotriazines. Silver compositions containing neodecanoic acid or other acids will also stick to bare copper. Copper compounds containing acids will bond well to bare copper. The adhesion measured in pull tests on various metal and substrate combinations is summarized in the accompanying table.

Curing Process and the Critical Temperature for Consolidation

Figure 3A:
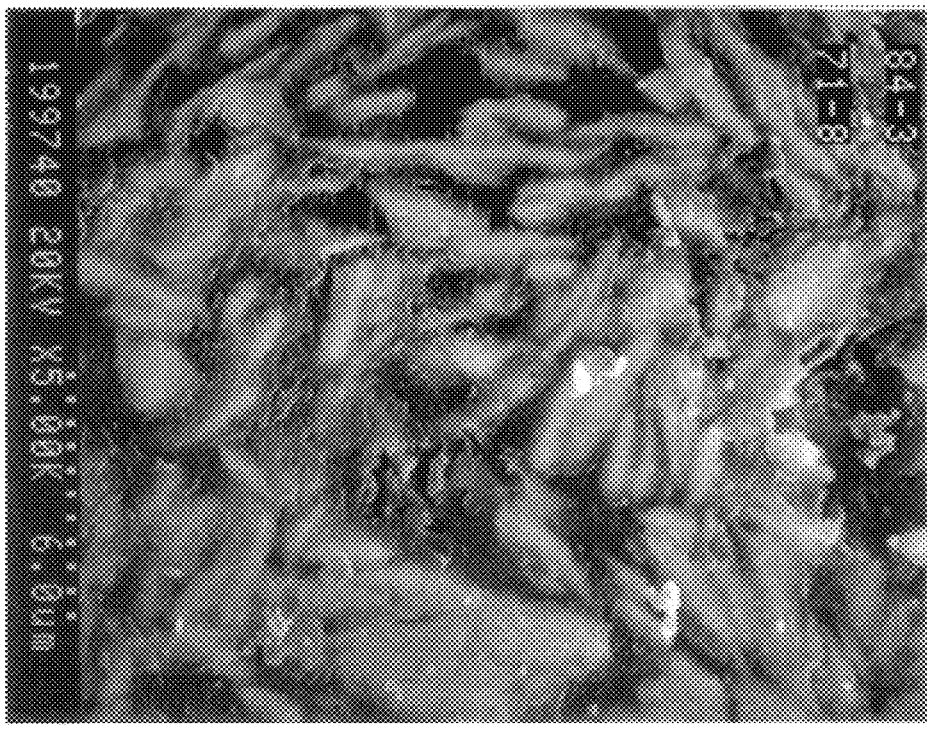
FIG. 3a is an SEM cross section of an unconsolidated copper trace, characteristic of the prior art.
Figure 3B:
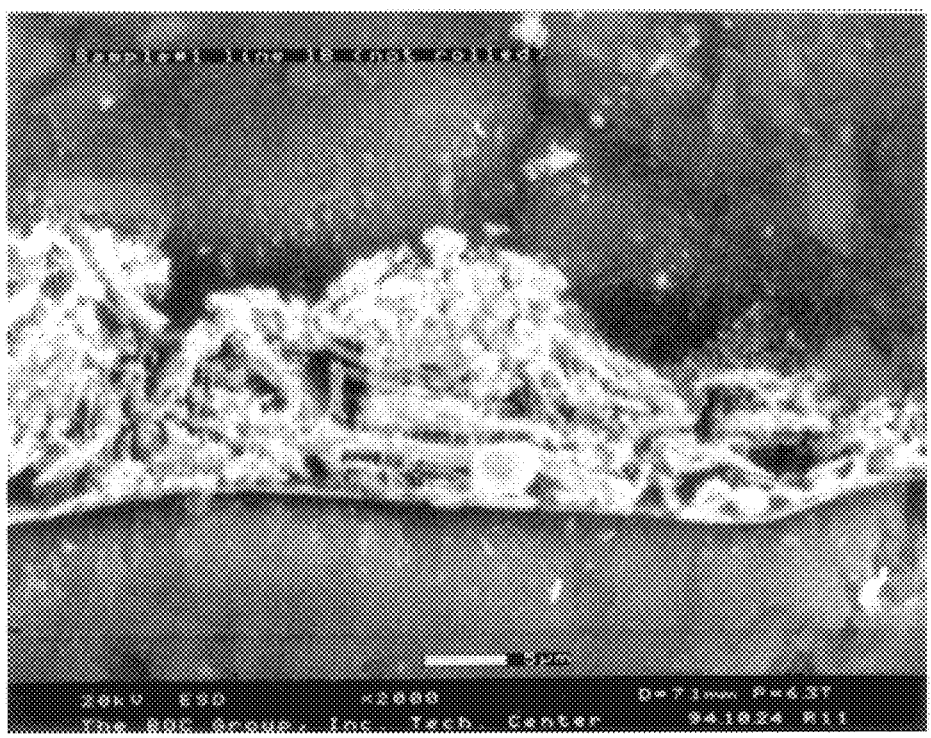
FIG. 3b is and SEM cross section of an unconsolidated silver trace characteristic of the prior art.

When the metallo-organic decomposition compound or the acid from which it is formed is mixed with the metal flake and colloidal metal powder constituents described above, printed as a relatively thin layer on an appropriate substrate, and heated to a critical temperature above the decomposition temperature of the metallo-organic compound, a reaction takes place which results in the sudden consolidation of the loosely aggregated metal constituents into a nearly solid metal trace with greatly reduced electrical resistivity. Scanning Electron Micrograph cross sections of traces which have been heated to decompose the metallo-organic compound but below the critical temperature is shown in FIGS. 3a for copper and 3b for silver mixtures respectively. In FIG. 3b the silver layer is shown as 10 and the FEP Kapton substrate is at 12. The individual metal flakes and powder particles can still be seen in both SEMs, much like a picture of the unheated mixture.

Figure 4A:
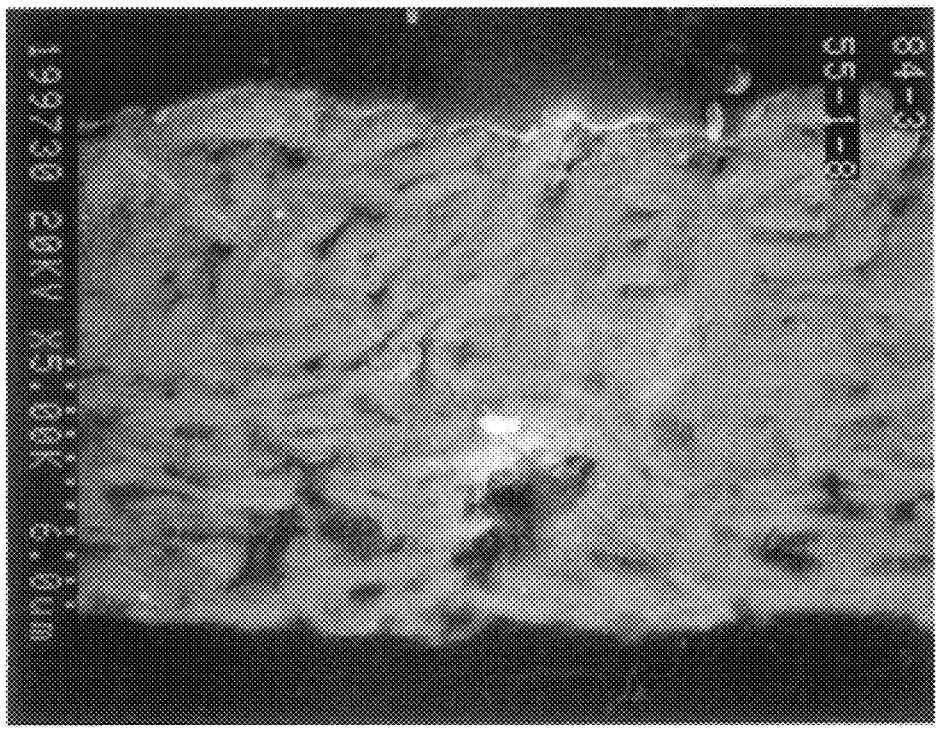
FIG. 4a is an SEM cross section of a well-consolidated copper trace characteristic of the present invention.
Figure 4B:
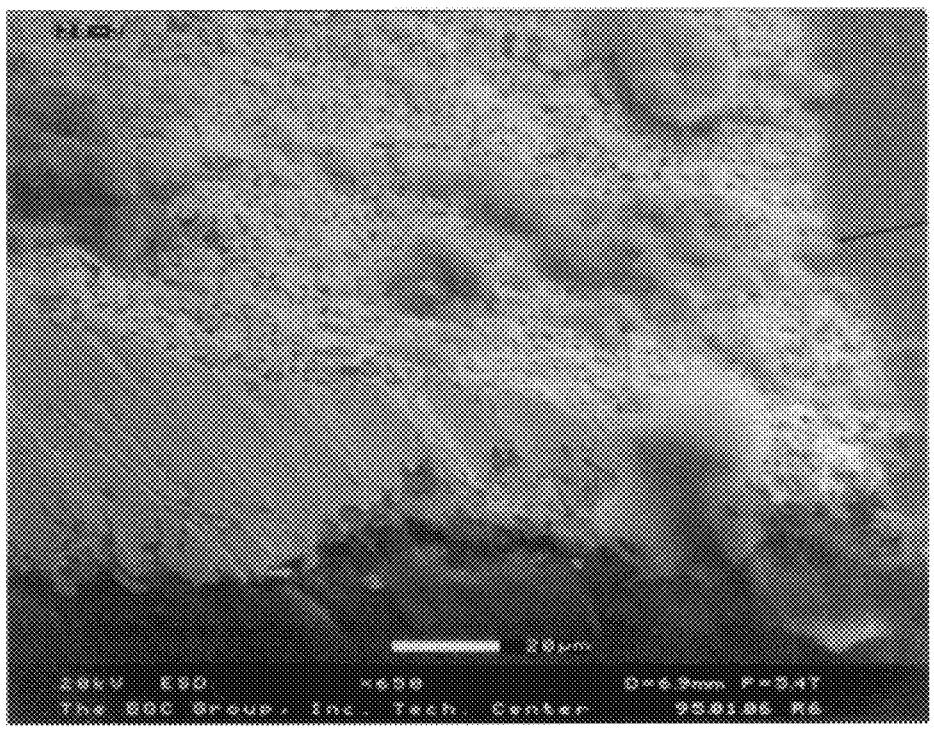
FIG. 4b is an SEM cross section of a well-consolidated silver trace characteristic of the present invention.
Figure 4C:
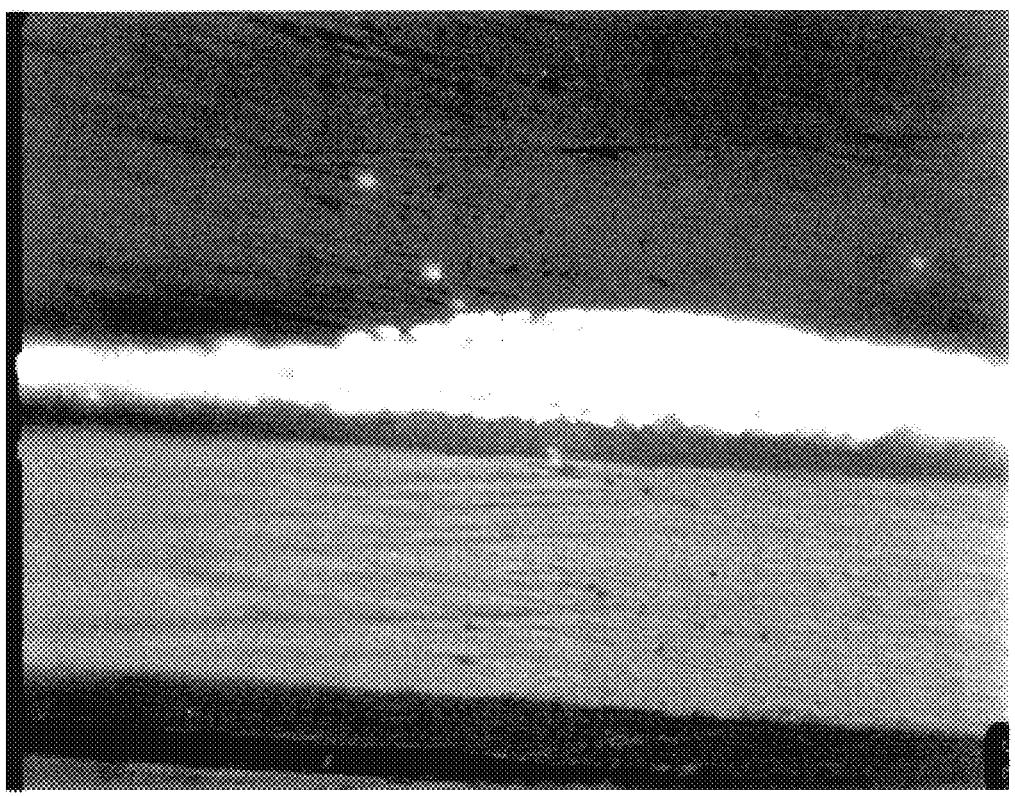
FIG. 4c is an SEM cross section of a well-consolidated gold trace characteristic of the present invention.

When the traces are heated above the critical temperature, there is a very rapid decrease in electrical resistivity, a dramatic increase in mechanical cohesive strength of the deposit and the appearance of the deposits changes, as shown in FIGS. 4a, b and c. Here copper, silver and gold mixtures have been heated above the critical temperature, and the metal flake and powder has consolidated into a bonded network of solid metal. In FIG. 4a the copper trace is at 10 and the Kapton FN substrate at 12. In FIG. 4b the silver deposit is shown at 20. The sample is tilted so its surface shows at 16 the substrate at 14 and the edge of the deposit at 18 FIG. 4c is at a lower magnification so that the deposit appears at 30, the polyimide substrate at 32 and the FEP Teflon layers at 34 and 36.

Figure 5A:
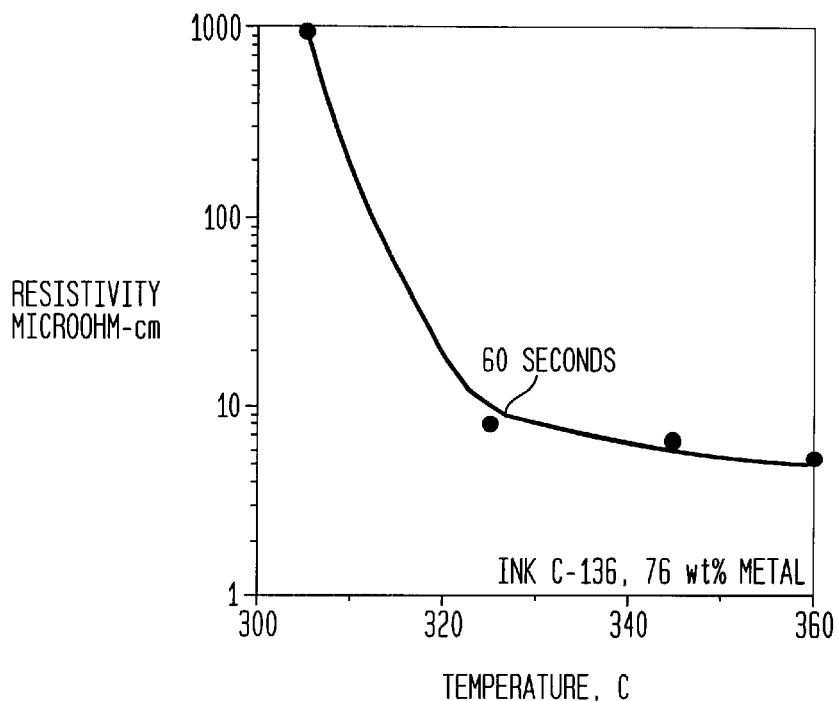
FIG. 5a is a plot of electrical resistivity vs. temperature for a copper composition of the present invention.
Figure 5B:
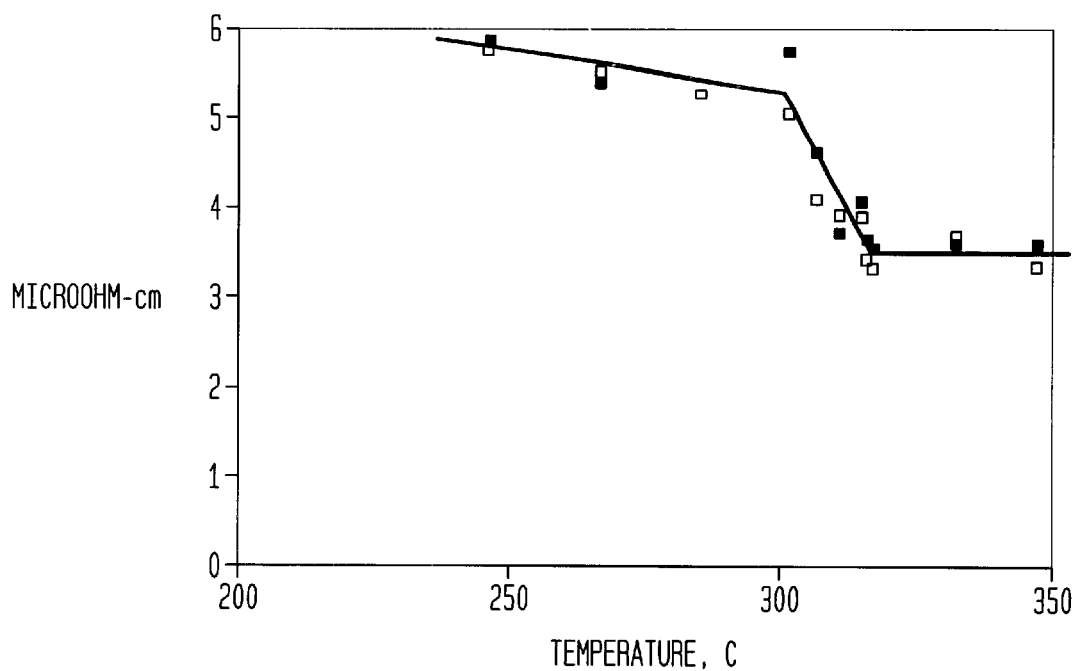
FIG. 5b is a plot of electrical resistivity vs. temperature for a silver composition of the present invention.

The critical temperature for copper and silver mixtures is shown in FIGS. 5a and 5b. In both cases traces were screened onto Kapton substrates and held at the critical temperature for 60 seconds. For copper (and gold) the critical temperature is in excess of 300° C. It can be seen that between 305 and 325° C. the resistivity of the traces drops by a factor of 100 to a value below 10 microohm-cm. The bulk resistivity of copper is 1.7 microohm-cm. At the same temperature at which the resistivity drops the mechanical properties of the traces improve equally dramatically. From being brittle and poorly adherent as measured by creasing the samples and pulling the traces off with Scotch Tape the samples become ductile enough to survive a sharp 180 degree crease in the 75 micron (3 mil) substrate followed by tape testing. The crease test is equivalent to an elongation of the metal trace of 17%. The tape test is equivalent to an adhesion of approximately 10 Newtons/cm (6 lb per lineal inch) Heating to still higher temperatures decreases the resistivity only slightly.

For silver, the decrease in resistivity with processing temperature is not as dramatic as with copper but the conversion from a poorly-consolidated material which is easily fragmented to a ductile metal is equally sharp. The critical temperature is approximately 230° C.

Figure 6A:
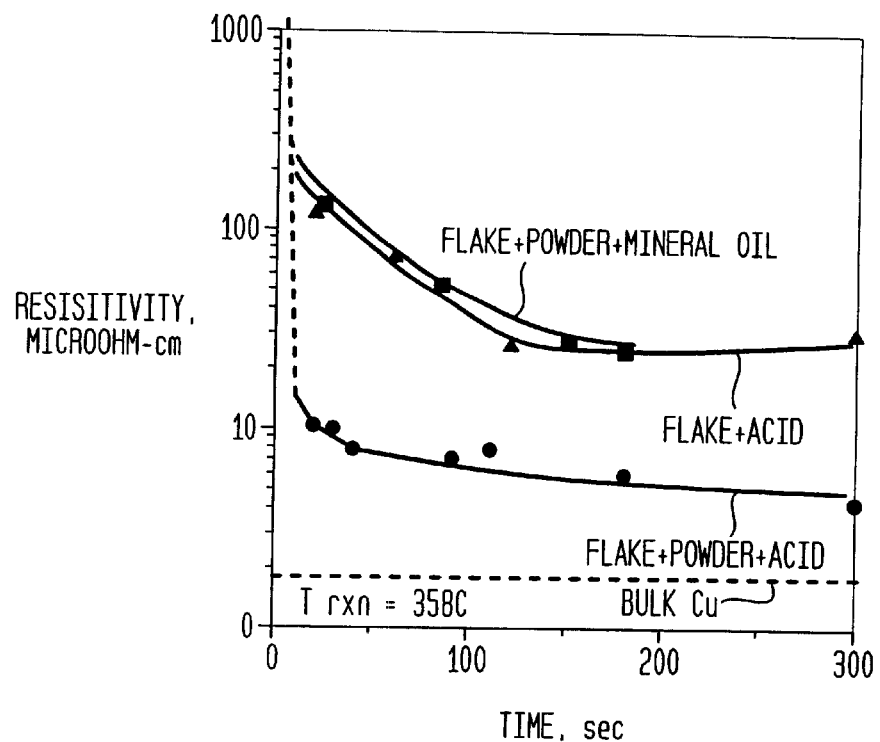
FIG. 6a is a plot of electrical resistivity vs. time for a copper composition of the present invention.
Figure 6B:
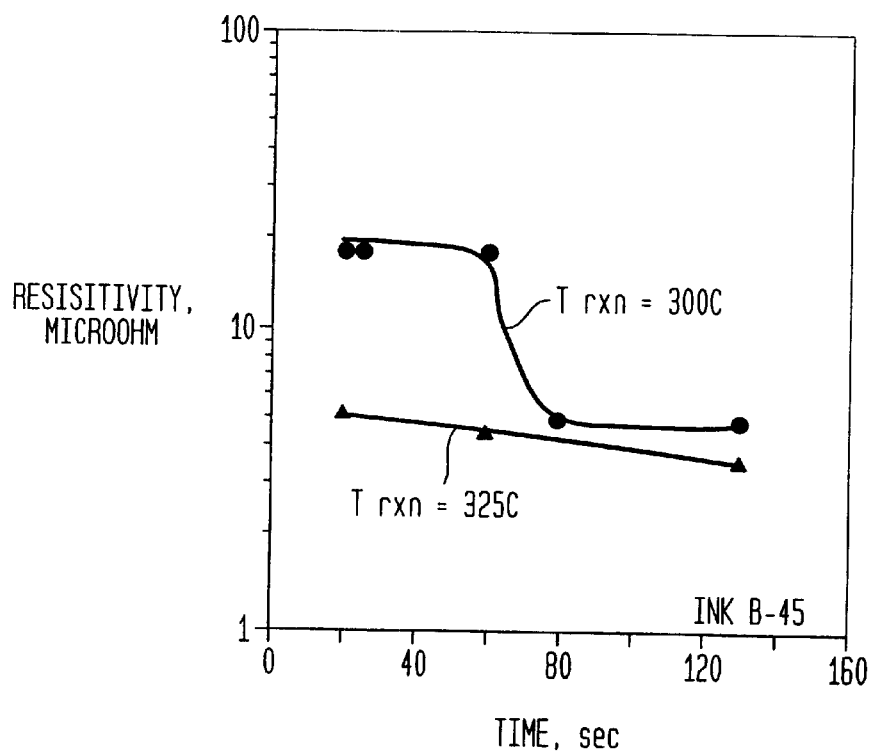
FIG. 6b is a plot of electrical resistivity vs. time for a silver composition of the present invention.

The electrical resistivity of traces heated to a temperature above the critical temperature in various times is shown for copper in FIG. 6a and for silver in FIG. 6b. It can be seen that a dramatic decrease in resistivity occurs in a few seconds at temperature, followed in the case of copper by further consolidation over a period of a few minutes. It is this very rapid conversion of poorly consolidated metal particulates to nearly solid metal at temperatures less than half the melting point of the bulk metal which constitutes the present invention. The influence of the critical ingredients can be seen in FIG. 6a. A mixture of copper flake plus neodecanoic acid plus colloidal copper powder per the preferred embodiment of the present invention achieves a resistivity of less than 10 microohm-cm in approximately 10 seconds at temperature. A mixture of flake and acid only achieves some reduction in resistivity but only to 25–100 microohm cm similar to polymer thick film compositions in which the metal flakes are not well-bonded. Similarly, when the mixture contains metal flake plus colloidal metal powder plus tetradecane, an inert saturated hydrocarbon, in place of the reactive organic medium, the resistivity is poor and no consolidation takes place.

Chemistry of Metallo-Organic Decomposition in the Presence of Metal Powders

It is believed that a extraordinary reaction is taking place between the ROM and metal powder constituents of the compositions of this invention which promotes consolidation.

The evidence for this is two fold:
1) The consolidation of the metal powder to a solid metal conductor is extremely rapid.
2) The consolidation of the metal powder to a solid metal conductor occurs at a much lower temperature than conventional sintering to produce solid metal objects from metal powders, as practiced in the powder metal industry and in the thick-film electronic industry.

The results shown in FIG. 5a and FIG. 5b along with FIG. 6a and FIG. 6b could not possibly be produced by conventional sintering or by conventional thick film technology. Sintering is a time-temperature process in which necks form between particles in contact which grow by bulk solid diffusion until the original particle compact is transformed into a solid metal body. The activation energy for bulk diffusion is of the order of 45–60 Kcal/mole (180–250 J/mole) for copper, silver and gold. Typically copper is sintered at 650° C. to 900° C., and sintering times range from minutes to hours at pressures of tons per square inch.(Handbook of Powder Metallurgy, Henry H. Hausner, Ed., Chemical Publishing Co, Inc. NY, N.Y., p 164–167, (1973), The rate of sintering at 325° C. can be expected to be lower than that at the usual thick film sintering temperature of 850° C. by a factor of seventy million ($7 \times 10^7$). A ten minute process at 850° C. will take 1300 years at 325° C.

It is not understood why the compositions of the present invention consolidate as rapidly as they do at a temperature compatible with polymer-based substrates. It may be that the finely divided metal powders have a higher surface energy than bulk metal, and in the ROM environment in which it is processed, it is free of surface layers which would inhibit metal-to-metal contact and consolidation.

The surface energy of the noble metals is as follows;

| | | |
|---|---|---|
| Cu | 1670 ergs. cm$^2$ @ 1047° C. |
| Ag | 1140 ergs. cm$^2$ @ 907° C. |
| Au | 1410 ergs. cm$^2$ @ 1027° C. |

(Chemistry in Two Dimensions-Surfaces, G. A. Somorjai, Cornell University Press, (1981)

For copper the excess surface energy of a 10 nanometer particle over the bulk solid is only 6800 J/mole compared to the activation energy for bulk diffusion of 250,000 J/mole. It does not seem that even colloidal metal could have enough surface energy to consolidate by bulk diffusion.

Surface diffusion is known to occur at much lower temperatures than bulk diffusion. A transition temperature exists above which surface diffusion is rapid, and this temperature is found empirically to be approximately ⅓ the melting point in degrees K. (Thin Film Deposition; Principles and Practices, D. L. Smith, McGraw Hill, 1995 p 170). For silver this transition temperature is 138° C., so surface diffusion could play a part at the temperatures at which consolidation is observed to take place. It is difficult, however, to imagine how a surface process could weld together the relatively massive flakes which constitute the bulk of the metal in the compositions of this invention.

Another explanation for these findings is that in the ROM-metal powder mixtures, the metallo-organic compound decomposes directly onto the preexisting metal particles, welding them together by:

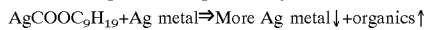

rather than by precipitation of new metal particles which then aggregate. There is likely to be an optimum metal content large enough to provide adequate area to nucleate metallo-organic decomposition but small enough to permit binding the metal particles together into a solid deposit with the metallo-organic compound available. The preexisting metal unquestionably provides a rigid framework, preventing shrinkage of the deposited metal and spreading of the molten ROM during decomposition which otherwise results in poor definition, poor adhesion and breaks in the traces.

It may be that the colloidal particles added to the compositions of this invention are themselves a source of additional metallo-organic by

providing a mechanism whereby the ROM can transport metal from high surface energy particles and edges to low surface area crevices and surfaces to consolidate the metal particles by a "chemical welding" process.

The ability to print high quality solid metal circuit traces on printed circuit boards has been sought for many years by many people skilled in the related arts. This experience is summarized above. The Ormet Transient Liquid Phase technology is one approach. The most widespread is the so-called polymer thick film technology based on silver-loaded and carbon-loaded epoxies. None of these methods produce traces which are the equal of those based on conventional high temperature thick film materials in a simple, rapid print-and-heat cycle as we do by the methods of this invention.

The critical temperature can be adjusted by mixing metallo-organic constituents. As mentioned above, gold amine octoate decomposes at temperatures up to 500° C. This is too high for use with polymer-based printed circuit substrates or most other electronic components. Gold t-dodecyl mercaptide decomposes at approximately 150° C. This is too low to bond effectively with the substrates of interest or with added gold flake. Gold neodecanoate decomposes at about 120–154° C. A mixture of gold amine octoate and gold neodecanoate has been used to achieve a decomposition temperature in the desirable range as described in Example 6 cited below.

Figure 7:
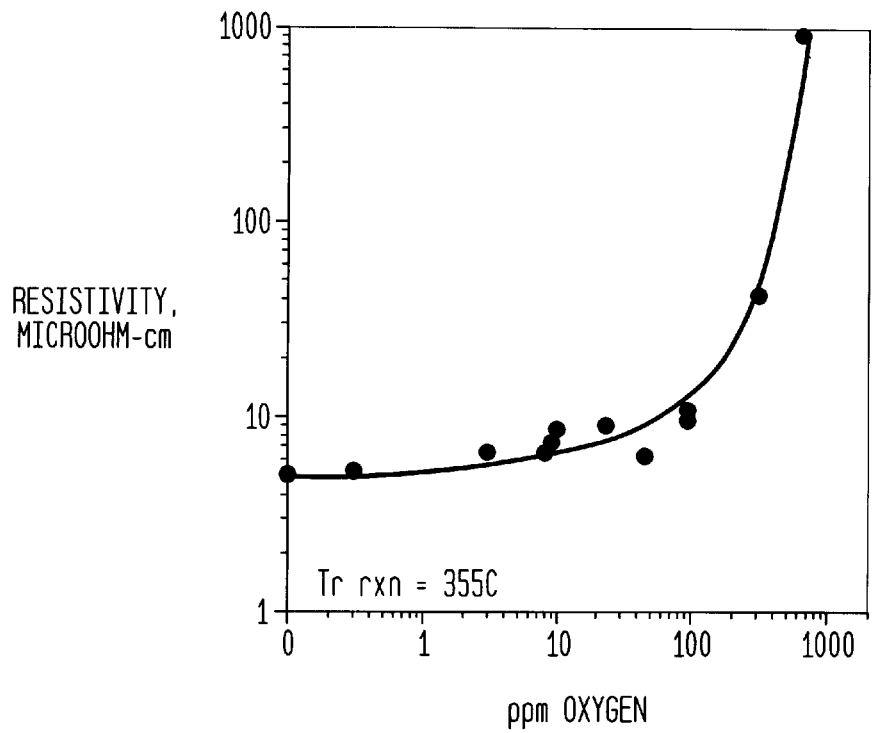
FIG. 7 is a plot of electrical resistivity of a copper trace of the present invention vs. oxygen content of the curing atmosphere.
Figure 8:
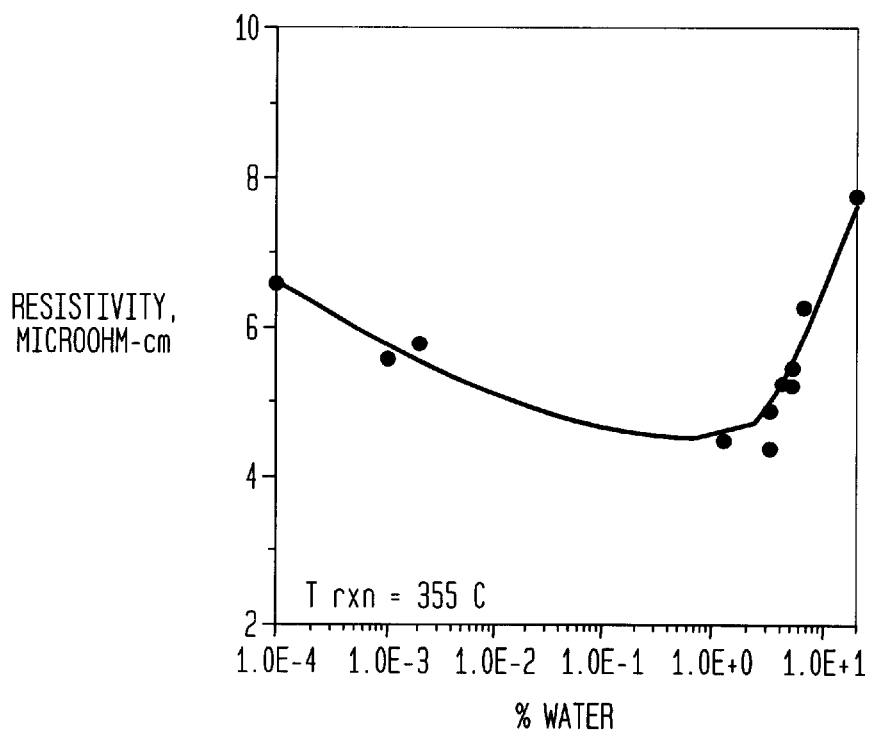
FIG. 8 is a plot of the electrical resistivity of a copper trace of the present invention vs. the moisture content of the curing atmosphere.

Both gold and silver mixtures can be heated in air since the elemental metals are the stable form at the temperature at which the metallo-organic constituent decomposes. Copper, however, requires the use of a protective atmosphere to prevent the formation of copper oxide which is the stable product of decomposition in air. A nitrogen atmosphere containing less than about 20 and most preferably less than 3 ppm by volume of oxygen has been found to be suitable as shown in FIG. 7. Addition of water vapor in the amount of about 5% has proven to be helpful in improving the conductivity of the resulting deposits as shown in FIG. 8.

Printing Processes using the Compositions of this Invention
Polymer Thick Film and Polymer Metallizing Polymer thick film technology uses mixtures of carbon or metal powders or flakes in polymer adhesives, primarily epoxies, to make printable mixtures. These can be applied to polymer substrates and cured at temperatures up to 176° C. to create conductor patterns in the same way that thick film inks and pastes are applied to ceramic and glass substrates at higher temperatures.

Polymer metallizing is used to provide a conductive layer on polymer parts such as desk top computer housings, usually for electrical shielding. Again, carbon or metal particles are suspended in a paint or other organic coating material.

Typically, the carbon coatings are substantially less electrically conducting than the metal-based coatings. The best are silver flake-loaded epoxies which can have resistivities as low as 50–60 microohm-cm.

There are applications in which the electrical conductivity achievable with metal-loaded epoxies is not adequate. An example is in applying a shielding coating to polymer-insulated wire. In this case the conductivity of the shielding should be comparable to the wire. Another example is applications in which the one to two mil thickness of a polymer thick film conductor is objectionable, and the objective is to achieve the thinnest possible conductor. This requires an electrical resistivity comparable to 1.6 microohm-cm, which is the bulk resistivity of silver. Furthermore, the conductivity of conventional polymer thick film materials is not stable over time due to changes in the resistance of the adventitious contacts between the individual silver flakes which give them their conductivity. Mechanical stresses, thermal expansion and corrosion can all play a role in this degradation.

The present invention provides an alternative to conventional polymer thick film compositions which can be cured at a temperature which a polymer-based substrate can withstand, while providing an electrical conductivity comparable to the pure metal and at least a factor of ten greater than the best polymer thick films.

The compositions of this invention may be applied to the adhesive-coated polymer substrates by any convenient printing process.

An advantage of printable metallization compounds is that three dimensional objects can be metallized which is not possible with metal foil and very difficult with sputtered or evaporated metal.

Wire coating can be carried out continuously in equipment analogous to wire enameling towers. An example of this application is recited below in Example 10.

Flexible Circuit Patches

Figure 9A:
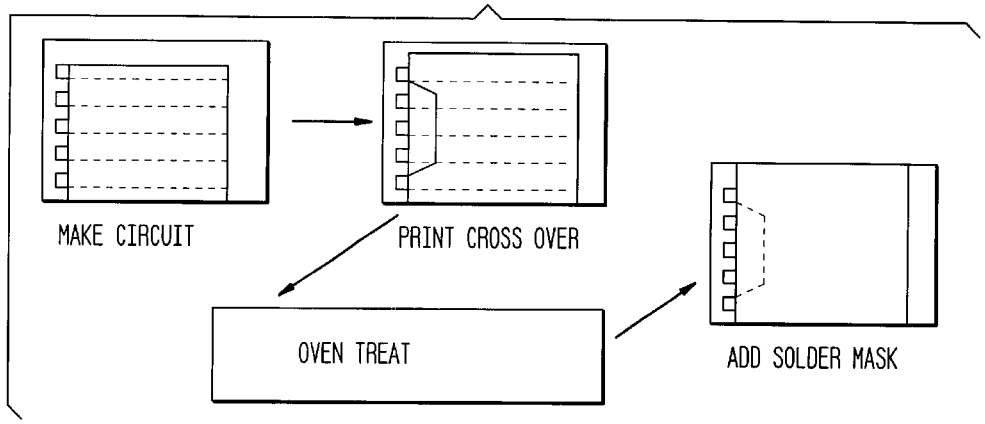
FIG. 9a is a schematic illustration of the application of the compositions and process of the present invention to creating patches on flexible circuits.

In many cases it is desired to add a few circuit traces to an existing printed circuit, either to repair mistakes, to implement changes or to complete the design without the expense of producing a complete multilayer circuit. This is difficult to do by conventional means, particularly when the traces must cross other traces, as they usually do. This invention provides a simple and inexpensive method for printing additional traces over the polymer coverlay or solder mask which is used as a final coat on most flexible and rigid printed circuits. Additional circuit traces connecting exposed metal contact pads are printed on the polymer surface and cured to solid metal by heating to a temperature which the polymer components can withstand. The method can also be used to create new metal pads and to bond components to the existing pads to complete the assembly of the circuit. A hybrid technology can be employed in which a photoresist is used to define the conductor traces with high resolution and the conductors themselves are installed by printing and heating the mixtures of this invention. The process is illustrated schematically in FIG. 9a.

Figure 9B:
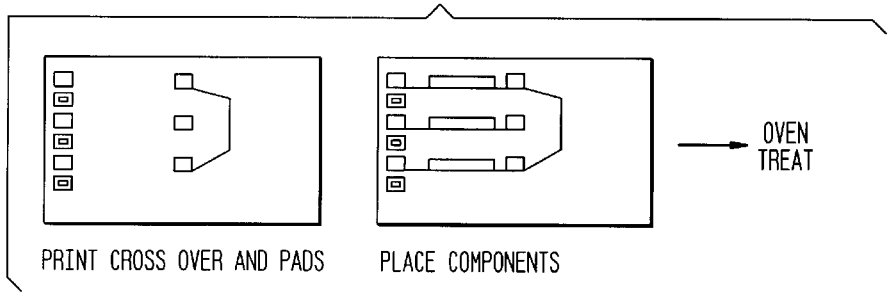
FIG. 9b is a schematic illustration of the application of the compositions and process of the present invention to simultaneously creating circuit traces and attaching components to them in lieu of soldering.
Figure 9C:
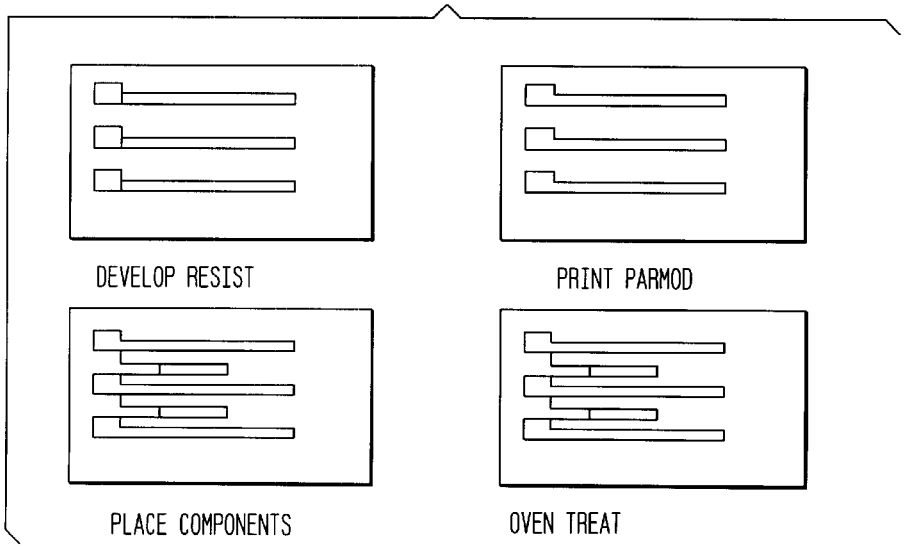
FIG. 9c is an illustration of the application of the compositions and processes of the present invention to a hybrid technology in which conductor traces developed in photo-defined dielectric materials are metallized simply and quickly.

The heat treating process is done under conditions very similar to soldering and in similar equipment. Additional cost savings can be realized by combining the curing of crossover traces and attachment of components. This is accomplished by printing additional material on the attachment pads for the components to be mounted on the circuit, placing the components on the uncured material with optional addition of additional material to the components themselves by printing or dipping, and heat treating the assembly to simultaneously consolidate and bond the additional traces and bond the components to the circuit, as shown in FIG. 9b To achieve the ultimate in high resolution circuit traces, the presently disclosed technology can be combined with photo sensitive materials to create a hybrid technology, as shown in FIG. 9c. A photosensitive resist or solder mask is applied to the surface of the circuit and exposed to the desired pattern of conductor traces, which can be very fine. The negative image is developed in the usual way be washing the unpolymerized, unexposed material away. The mixture of the present disclosure is applied by printing or doctor blading it into the circuit traces. Components may be placed at this stage if desired to make the circuit traces and assemble the circuit simultaneously, as described above. The circuit is heat treated in an oven which consolidates the mixture and completely polymerizes the resist or solder mask into an infusible, insoluble dielectric. An additional layer of solder mask or potting compound can be applied to protect the finished circuit in the usual way.

Printed Circuit Inner Layers

Most contemporary printed circuits are multilayers with attachment pads for components on the two surfaces and the bulk of the circuit connections on thin inner layers. The latter are laminated between the two surface layers to make the completed multilayer. Inner layers are produced by the same technology as outer layers and conventional single sided and double sided printed wiring boards. The inner layer substrate is similar to conventional glass reinforced epoxy FR-4 material but much thinner. The minimum is about 0.004 inches thick, limited by the fact that it is conventional to use two layers of glass fabric to avoid single strands of glass going from side to side and acting as potential short circuit paths. The epoxy-glass is laminated to copper foil on one or both sides to provide the electrical conductors to be developed by etching and/or plating.

To produce a finished inner layer, the copper clad substrate is laminated to a dry film resist or coated with a liquid resist. It is then exposed to ultraviolet light to partially polymerize the resist, which is usually an acrylic-epoxy mixture. The unexposed resist is removed by a weak caustic or solvent wash to develop a negative image. The image is then converted to circuitry by etching away the exposed copper to leave circuit traces protected by resist which is stripped by strong caustic. An alternative method is to electroplate copper followed by tin-lead etch resist on the exposed copper, strip the polymer resist and etch away the unprotected original copper foil.

The finished inner layers are stacked with the outer layers on the outside of the stack and with interleaving sheets of "prepreg" which is, again, two layers of glass cloth impregnated with B-stage epoxy resin . The stack is then cured in a laminating press typically at 400 psi, 350° F. for an hour. Often a vacuum press is used to remove entrained air and improve quality.

It can be seen that producing inner layers is a time-consuming and expensive process. The resist costs approximately $1.00 per square foot, and the lamination process is exacting, as is the exposure. The cost of copper foil laminated to the substrate is of the order of $3 per square foot, and most of it is etched away. The development step is time-consuming and produces hazardous waste. The etching step suffers from the same problems, as does the resist stripping process. There are numerous intermediate rinses and washes which have not been described separately which add to the cost. The average layer count, industry-wide in the U.S. is approximately seven. Many multilayer circuits have 20 or more layers. It can be seen that production of inner layers is a major expense. Total production in the U.S. is approximately a billion square feet of inner layer per year.

The compositions and processes of this invention replace this complexity with a simple print-and-heat technique which can produce inner layers very rapidly and very economically. The inner layer material is simply cleaned, printed and heat treated in an oven to convert the image to circuit conductors. The printed layers are then laminated in the usual way.

Figure 10A:
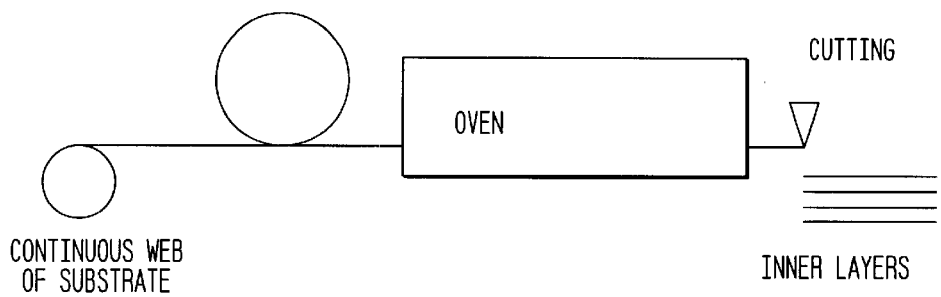
FIG. 10a is a schematic illustration of a method for producing inner layers by the compositions and processes of the present invention.

For still greater economies and higher production rates, the conductor pattern can be applied to a continuous web of substrate by a rotary press, much like printing a newspaper but with finer resolution, as shown in FIG. 10a. Gravure printing can be used in this application. Offset printing can produce very high resolution also. Ink jet printing and electrostatic printing at high speeds are candidates. Following the printing step, the circuits will be cured in an oven, still as a continuous web. The ability of these mixtures to cure to solid metal in seconds is critical to realizing this concept. Longer processing times would make the oven disproportionately large relative to the press and squander much of the speed advantage of high speed printing.

Figure 10B:
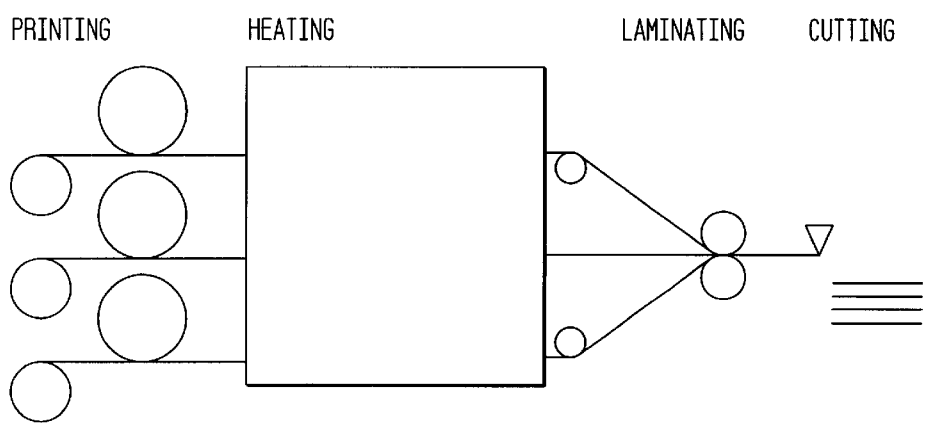
FIG. 10b is a schematic illustration of a method for producing finished multilayer circuits by the compositions and processes of the present invention.

The individual layers can then be cut apart and laminated in the usual way. Long term, for very high production runs, the newspaper analogy can be pushed further with multiple rotary presses turning out inner layers simultaneously which are cured in a single oven and perhaps laminated on the fly before die cutting to size. The lamination would be done by interleaving the hot, cured inner layers with hot prepreg and pressing them between rolls to expel the air between layers and bond the stack. After cooling, the stacks would be cut apart to create individual the circuits. A still less expensive approach is to use the adhesive on the back surface of single sided inner layers to laminate the stack without the use of prepreg. The process is illustrated schematically in FIG. 10b.

Direct Chip Attach and TAB Bonding

The leading edge of electronic packaging technology is now the direct attachment of Integrated Circuits (ICs) to Printed Wiring Boards (PWBs). The conventional method of packaging ICs is to cement them into a ceramic or plastic chip carrier and wire bond the individual input/output pads on the IC to individual pins on a metal lead frame. The IC is then potted in plastic or ceramic and covered with a lid for protection. The leads are separated from the frame and bent to shape for insertion into a socket or for soldering directly to pads on the PWB (surface mount technology).

These packages and the wire bonding operation are expensive, and the packaged semiconductors take up several times as much room as the ICs themselves. With the intense pressure for smaller devices and lower costs, there is a great incentive to eliminate the package and bond the IC direct to the PWB. An intermediate step is to replace the package and the wire bonding operation by bonding the IC to a lead frame which can then be bonded to the PWB. Since the lead frames in question are produced by etching metal laminate on a continuous polyimide tape, this technology is referred to as Tape Automated Bonding (TAB).

Some Chip on Board (COB) direct attachment is done by wire bonding the IC to pads on the PWB, but this, while conventional and reliable, is expensive and time consuming. Both TAB bonding and the more advanced COB applications are gang bonded by "bumping" the pads on the IC with added metal and soldering the bumps on mating pads on the tape or the PWB. The bumping process itself is time-consuming and expensive because it is done by depositing a number of metallic layers under vacuum using photolithographic techniques. Preparing the tapes or circuit pads is expensive because it is at the limit of resolution of conventional subtractive etching technology with 50 micron (0.002 inch) lines and spaces. The tapes are further processed to remove the polymer in the center portion leaving very fine and fragile metal fingers pointing in toward the IC which can be individually bonded to the pads. A technology in which ICs could be gang bonded to traces on a PWB or a polyimide tape in a single operation could achieve a major simplification and cost reduction. The compositions of the present invention can be applied to ICs and/or to polymer-based substrates to act as a bonding agent to secure the IC to the substrate with all the electrical connections made simultaneously and reliably.

The pads on ICs are almost universally made of aluminum, which is compatible with the silicon semiconductor, is a good electrical conductor and is easily and economically applied by evaporation or sputtering. Aluminum is not easy to bond to due to the very tenacious native oxide which protects the aluminum surface from oxidation and corrosion. Wire bonding and chip bumping have to overcome this obstacle to obtain reliable bonds. In the case of wire bonding, the connections are made to balls formed on the end of 0.001 inch diameter gold wire by welding them to the aluminum, usually by ultrasonic agitation to mechanically disrupt the oxide film and cold weld the gold to the aluminum. In the case of chip bumping, a layer of an intermediate bonding metal such as titanium-tungsten alloy is deposited by sputtering to make contact with the aluminum and isolate it from the material of the bump which is deleterious to the silicon. Other layers are added as well as the copper or solder bump material. All of these operations require photolithographic masking and are quite expensive. A polyimide insulating layer is often applied to the surface of the chip to protect it from the subsequent processing by covering all but the pads.

Two methods of applying the compositions of this invention to chips without the necessity for expensive photolithographic steps are as follows:

Method 1

Figure 11A:
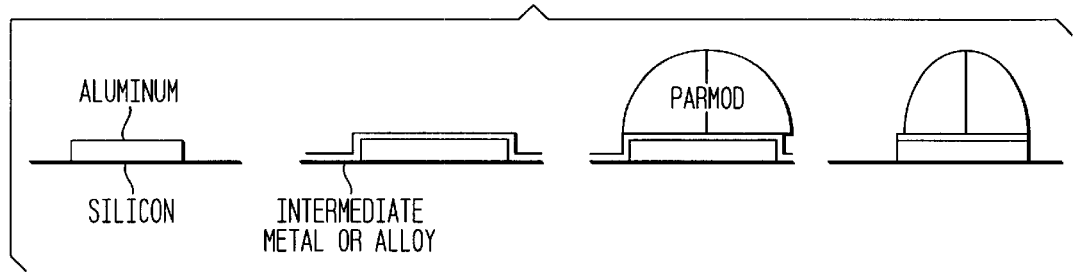
FIG. 11 Is an SEM of a multilayer circuit fabricated by the methods of the present invention.
Figure 11B:
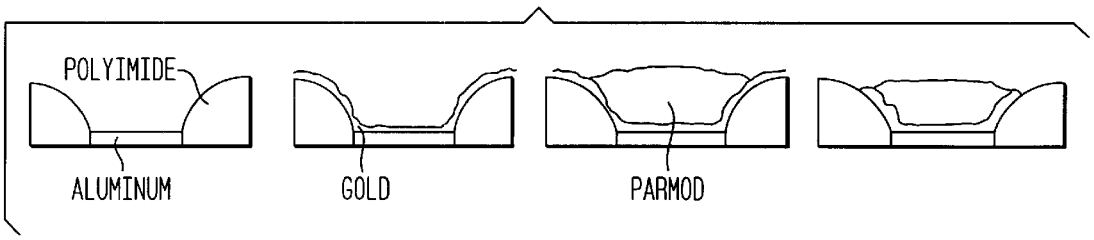

1) Sputter clean the chip surface to remove the aluminum oxide and immediately sputter on a layer of gold, silver, copper, nickel, titanium, molybdenum, tungsten, or other intermediate metal or alloy to which both the aluminum and the composition of this invention will bond.
2) Print the composition on the pads to a thickness which will produce somewhat more than the desired bump height after curing.
3) Cure the composition to produce solid metal bumps.
4) Sputter clean the chip again or chemically etch it to remove the intermediate metal coating between bumps and some but not all of the bump material This method is illustrated in FIG. 11a.

Method 2

1) Add a photo patterned polyimide or other dielectric insulating layer to chip surface as is now done.
2) Sputter clean and immediately coat with intermediate metal as before
3) Print as before
4) Sputter clean or etch as before.

The compositions of this invention may be applied to the IC by any convenient printing process. Tests have been done by screen printing conductor images. The mixtures have also been applied by stenciling and ink jet printing. Gravure printing, both direct and offset can be used to produce fine line images. Offset lithography can be used, as can direct impressions by rubber or metal plates. If a mixture can be found which will bond directly to aluminum without the gold or other bonding layer, a particularly elegant lithographic method can be used. The compositions of this invention do not stick to untreated polyimide surfaces. The IC can be coated with polyimide and patterned to expose the pads as before. The composition can then be applied by doctor blading it across the surface or by a rough printing process with poorer resolution than the pads. During curing, the composition will detach from the polyimide surface and bead up on the aluminum pads producing the exact structure desired with higher resolution than the printing process used to apply it. Such a mixture might include fluoride based fluxes to dissolve the aluminum oxide layer during the heat treating process. The same process could be used to mask off and print very fine conductors on the surface of the semiconductor IC itself to connect pads or reroute I/O leads.

The bumped chips of this invention must be attached either to a polyimide tape or a PWB with matching metallic circuit traces. Such traces may be produced by the methods of this invention by a simple print-and-heat process with high resolution Additional printing processes are applicable to polymer films which are not applicable to ICs. In particular electrostatic methods (xerography) is possible and along with ink jet printing provides the ability to generate conductor patterns direct from CAD files. This provides great flexibility in design and in small quantity manufacture and inventory control.

The highest possible resolution is provided by photolithographic techniques and a hybrid technology in which the dielectric is patterned photographically and a composition of this invention is printed or doctored into the grooves is a highly reliable and promising way to produce very fine conductor patterns for TAB and direct attach. The method is the same as method B described above for patterning the chip and the method shown in FIG. 9c above.

The next highest resolution may be provided by electrostatic printing with liquid toner suspensions with particle diameters of a few microns. S. P. Schmidt, et al., "Handbook of Imaging Materials", Chapter 5, pp. 227–252, A. S. Daimond, Ed., (Marcel Dekker, NY).

Following printing of the IC and the substrate, the bonding process may be carried out in several ways.

1) Both sets of contacts can be cured and additional composition printed on and reheated similar to soldering. (Solder could also be used as is now done, but the compositions of this invention provide a superior solution by virtue of not needing a flux removal step and not introducing extraneous metals into the sensitive semiconductor contact.)

2) One set of contacts can be heat treated and the other printed and adhered to the first before reheating to achieve the bond.

3) One set of contacts only is printed and the other component is adhered to it prior to heat treating to achieve the application and the bond simultaneously.

Following printing, the image is converted to metal by heating in an oven.

EXAMPLES

The examples described below indicate how the individual constituents of the preferred compositions and the conditions for applying them function to provide the desired result. The examples will serve to further typify the nature of this invention, but should not be construed as a limitation in the scope thereof which scope is defined solely in the appended claims.

Example 1
Copper Composition with Copper Flake, Copper Powder, and Acid

A composition has been prepared for producing conductive copper traces on dielectric substrates.

1) A mixture of 47 parts by weight copper flake, 29 parts by weight copper powder ("Nanomyte", Nanopower Enterprises, Piscataway, N.J.), and 24 parts by weight neodecanoic acid was combined and blended by hand in a glove box under nitrogen.

2) The mixture was roll milled in air to produce a homogeneous ink.

3) The ink was screen printed onto a KAPTON® 300 FN 929 dielectric substrate at room temperature in air.

4) The traces were heated in a tube furnace at 350° C. for 180 seconds in a nitrogen-water vapor atmosphere.

After heating, the circuit trace was dry to the touch, the organic constituents having been completely removed. The electrical resistivity of the circuit trace (23.7 cm long, 0.4 mm wide) was calculated to be 5 microohm-cm by measuring the resistance of the trace and weighing the amount of metal deposited. The mass divided by the density gives the total volume of metal. Scotch tape was applied to the circuit trace and immediately removed at a 90 degree angle to determine the bond strength of the copper to the substrate. No metal was removed with the tape.

Example 2
Copper Flake and Acid

A composition has been prepared for producing conductive copper traces on dielectric substrates to show the detrimental effect of eliminating the colloidal copper powder ingredient.

1) A mixture of 76 parts by weight copper flake and 24 parts by weight neodecanoic acid was combined and blended by hand in a glove box.

2) The mixture was roll milled in air to produce a homogeneous ink.

3) The ink was screen printed onto a KAPTON® 300 FN 929 dielectric substrate at room temperature in air.

4) The traces were heated in a tube furnace at 350° C. for 180 seconds in a nitrogen-water vapor atmosphere.

After heating, the circuit trace was dry to the touch, the organic constituents having been completely removed. The electrical resistivity of the circuit trace was calculated to be 24 microohm-cm. Scotch tape was applied to the circuit trace and immediately removed at a 90 degree angle to determine the bond strength of the copper to the substrate. Some of the copper was removed with the tape.

Example 3
Copper Powder and Acid

A composition has been prepared for producing conductive copper traces on dielectric substrates illustrating the detrimental effect of eliminating the copper flake ingredient.

1) A mixture of 77 parts by weight copper powder and 24 parts by weight neodecanoic acid was combined and blended by hand in a glove box.

2) The mixture was roll milled in air to produce a homogeneous ink.

3) The ink was screen printed onto a KAPTON® 300 FN 929 dielectric substrate at room temperature in air.

4) The traces were heated in a tube furnace at 350° C. for 180 seconds in a nitrogen-water vapor atmosphere.

After heating, the circuit trace was dry to the touch, the organic constituents having been completely removed. The circuit trace was not continuous, thus it did not conduct electricity. Scotch tape was applied to the circuit trace and immediately removed at a 90 degree angle to determine the bond strength of the copper to the substrate. No metal was removed with the tape.

Example 4
Copper Flake, Copper Powder, and Tetradecane

A composition has been prepared for producing conductive copper traces on dielectric substrates showing the detrimental effect of substituting an unreactive saturated hydrocarbon for the Reactive Organic Medium, 1) A mixture of 47 parts by weight copper flake, 29 parts by weight copper powder, and 24 parts by weight tetradecane was combined and blended by hand in a glove box.
2) The mixture was roll milled in air to produce a homogeneous ink.
3) The ink was screen printed onto a KAPTON® 300 FN 929 dielectric substrate at room temperature in air.
4) The traces were heated in a tube furnace at 350° C. for 180 seconds in a nitrogen-water vapor atmosphere.

After heating, the circuit trace was dry to the touch, the organic constituents having been completely removed. The electrical resistivity of the circuit trace (23.7 cm long, 0.4 mm wide) was calculated to be 25 microohm-cm. Scotch tape was applied to the circuit trace and immediately removed at a 90 degree angle to determine the bond strength of the copper to the substrate. Some of the copper was removed with the tape.

Example 5
Silver Neodecanoate, Silver Flake, and α-terpineol

A composition has been prepared for producing conductive silver traces on dielectric substrates containing silver flake, a silver metallo-organic decomposition compound and a reactive rheology modifier.

1) A mixture of 12 parts by weight silver flake, 3 parts by weight silver neodecanoate, and 1.8 parts by weight (α-terpineol was combined and blended by hand in a glove box under nitrogen.
2) The mixture was roll milled in air to produce a homogeneous ink.
3) The ink was screen printed onto a KAPTON® 300 FN 929 dielectric substrate at room temperature in air.
4) The traces were heated in a box furnace at 300° C. for 60 seconds in air.

After heating, the circuit trace was dry to the touch, the organic constituents having been completely removed. The electrical resistivity of the circuit trace (23.7 cm long, 0.4 mm wide) was calculated to be 3.7 microohm-cm. Scotch tape was applied to the circuit trace and immediately removed at a 90 degree angle to determine the bond strength of the silver to the substrate. No metal was removed.

Example 6
Silver Flake, Silver Neodecanoate, and Acid

A composition has been prepared for producing conductive silver traces on dielectric substrates and on copper surfaces with neodecanoic acid as a reactive rheology modifier and flux.

1) A mixture of 12 parts by weight silver flake, 3 parts by weight silver neodecanoate and 1.6 parts by weight neodecanoic acid was combined and blended by hand in a glove box.
2) The mixture was roll milled in air to produce a homogeneous ink.
3) The ink was screen printed onto a KAPTON® 300 FN 929 dielectric substrate at room temperature in air.
4) The traces were heated in a box furnace at 290° C. for 60 seconds in air.

After heating, the circuit trace was dry to the touch, the organic constituents having been completely removed. The electrical resistivity of the circuit trace (23.7 cm long, 0.4 mm wide) was calculated to be 3.2 microohm-cm. Scotch tape was applied to the circuit trace and immediately removed at a 90 degree angle to determine the bond strength of the silver to the substrate. No metal was removed.

Example 7
Gold Flake, Gold Neodecanoate, and Gold Amine Octoate

A composition has been prepared for producing conductive gold traces on dielectric substrates with a ROM containing two metallo-organic decomposition compounds for temperature optimization.

1) A mixture of 8 parts by weight gold flake, 1 part by weight gold neodecanoate, and 1 part by weight gold amine 2-ethyl hexanoate. The mixture was combined and blended by hand in a glove box.
2) The mixture was roll milled in air to produce a homogeneous ink.
3) The ink was screen printed onto a KAPTON® 300 FN 929 dielectric substrate at room temperature in air.
4) The traces were heated in a box furnace at 365° C. for 600 seconds in air.

After heating, the circuit trace was dry to the touch, the organic constituents having been completely removed. The electrical resistivity of the circuit trace (23.7 cm long, 0.4 mm wide) was calculated to be 7.4 microohm-cm. Scotch tape was applied to the circuit trace and immediately removed at a 90 degree angle to determine the bond strength of the gold to the substrate. No metal was removed.

Example 8.
Silver Ink on Substrate FR-4

A composition has been prepared for producing conductive silver traces on glass-reinforced epoxy dielectric substrates.

1) A mixture of 12 parts by weight silver flake, 3 parts by weight silver neodecanoate, and 1.8 parts by weight α-terpineol containing 15% silver colloid was combined and blended by hand in a glove box.
2) The mixture was roll milled in air to produce a homogeneous ink.
3) The ink was screen printed onto a KAPTON® 300 FN 929 dielectric substrate at room temperature in air.
4) The traces were heated in a box furnace at 270° C. for 60 seconds in nitrogen.

After heating, the circuit trace was dry to the touch, the organic constituents having been completely removed. The electrical resistivity of the circuit trace (23.7 cm long, 0.4 mm wide) was calculated to be 3.2 microohm-cm. Scotch tape was applied to the circuit trace and immediately removed at a 90 degree angle to determine the bond strength of the silver to the substrate. No metal was removed.

Example 9
Copper on KAPTON® EKJ

A composition has been prepared for producing conductive copper traces on polyimide-coated dielectric substrates.

1) A mixture of 47 parts by weight copper flake, 29 parts by weight copper powder, and 24 parts by weight neodecanoic acid was combined and blended by hand in a glove box.
2) The mixture was roll milled in air to produce a homogeneous ink.

3) The ink was screen printed onto a dielectric substrate at room temperature in air.
4) The dielectric used was KAPTON® EKJ film which consists of a type E polyimide film coated on both sides with a polyimide with a low glass transition temperature of 220° C. which can act as a thermoplastic adhesive.
5) The traces were heated in a tube furnace at 350° C. for 180 seconds in a nitrogen-water atmosphere.

After heating, the circuit trace was dry to the touch, the organic constituents having been completely removed. The electrical resistivity of the circuit trace (23.7 cm long, 0.4 mm wide) was calculated to be 4.5 microohm-cm. Scotch tape was applied to the circuit trace and immediately removed at a 90 degree angle to determine the bond strength of the copper to the substrate. No metal was removed with the tape.

Example 10
Silver on KAPTON® EKJ

A silver composition has been prepared for producing conductive silver traces on dielectric substrates.
1) A mixture of 12 parts by weight silver flake, 3 parts by weight silver neodecanoate, and 1.8 parts by weight α-terpineol was combined and blended by hand in a glove box.
2) The mixture was roll milled in air to produce a homogeneous ink.
3) The ink was screen printed onto a KAPTON® EKJ dielectric substrate at room temperature in air.
4) The traces were heated in a box furnace at 300° C. for 60 seconds in air.

After heating, the circuit trace was dry to the touch, the organic constituents having been completely removed. The electrical resistivity of the circuit trace (23.7 cm long, 0.4 mm wide) was calculated to be 3.1 microohm-cm. Scotch tape was applied to the circuit trace and immediately removed at a 90 degree angle to determine the bond strength of the silver to the substrate. No metal was removed.

Example 11
Copper Bonding to Copper Foil

A composition has been prepared for producing conductive copper traces bonded to copper foil.
1) A mixture of 47 parts by weight copper flake, 29 parts by weight copper powder, and 24 parts by weight neodecanoic acid was combined and blended by hand in a glove box.
2) The mixture was roll milled in air to produce a homogeneous ink.
3) The ink was screen printed onto a copper foil substrate at room temperature in air.
4) The traces were heated in a tube furnace at 350° C. for 180 seconds in a nitrogen-water atmosphere.

After heating, the circuit trace was dry to the touch, the organic constituents having been completely removed. Scotch tape was applied to the circuit trace and immediately removed at a 90 degree angle to determine the bond strength of the copper to the substrate. No metal was removed with the tape.

Example 12
Silver bonding to copper clad FR-4

The composition of Example 6 has been applied to copper clad glass-reinforced epoxy substrates.
1) A mixture of 12 parts by weight silver flake, 3 parts by weight silver neodecanoate, and 1.6 parts by weight neodecanoic acid was combined and blended by hand in a glove box.
2) The mixture was roll milled in air to produce a homogeneous ink.
3) The ink was screen printed onto a copper-clad FR-4 substrate at room temperature in air.
4) The traces were heated in a box furnace at 260° C. for 15 seconds in air.

After heating, the circuit trace was dry to the touch, the organic constituents having been completely removed. Scotch tape was applied to the circuit trace and immediately removed at a 90 degree angle to determine the bond strength of the silver to the substrate. No metal was removed.

Example 13
Polymer Metallization

An example of a mixture which has been used for experiments on polymer metallization is one made up of 12 parts silver flake, 3 parts silver neodecanoate and 1.8 parts α-terpineol by weight prepared as described in the previous examples. A demonstration of polymer metallizing using this composition has been carried out by applying a shielding coating to wire-wrap wire. Kynar-insulated #30 wire was coated by rubbing with the silver mixture described above and cured in an oven at 277 C. The resulting silver coating was firmly attached to the wire. The wire could be tied in an overhand knot and drawn tight without flaking the coating off. A linear resistance of 0.2 ohms per cm was achieved with a coating of 0.0006 grams of silver per cm, equivalent to a resistivity of 12 microohm-cm.

Example 14
Polymer Metallization

In another demonstration a sample of Kynar-insulated wire was coated with the silver mixture and heated at 306 C. The metal was well adhered and could withstand being tied in a knot. The resistance was approximately 0.04 ohm/cm.

To date the lowest critical temperatures obtained have been in the vicinity of 220° C. with silver mixtures, as described in the examples. Similar results have been achieved with both copper and gold, though at somewhat higher temperatures in the 300–350° C. range. These conditions are still orders of magnitude less severe than those required for conventional sintering and thick film processing. The cited examples demonstrate repeatedly with different metals and different substrates that the compositions and the methods of the present invention can produce well-consolidated, well-bonded thick film circuit traces on conventional polymer-based substrates which could not have been anticipated by anyone skilled in the art of circuit board manufacture or thick film technology.

Figure 12:
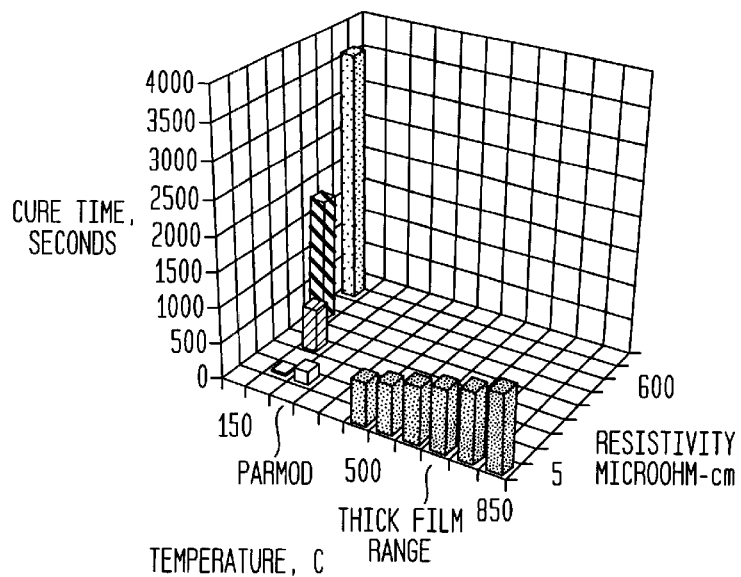
FIG. 12 is comparison of the characteristics of the compositions of the present invention compared to those of the prior art.

The compositions and methods of the present invention offer a wholly new approach to creating fully additive electronic circuitry. FIG. 12 shows a comparison of the electrical resistivity of traces made by the method of this invention compared to those of prior art methods along with the respective processing conditions of temperature and curing time. It can be seen that the present invention provides conductivity (and solderability) equivalent to conventional thick film processing but at a temperature hundreds of degrees lower. It is compatible with polymer substrates but offers orders of magnitude better electrical conductivity and processing speed than existing polymer thick film and transient liquid phase alternatives.

We claim:
1. A compositionl of matter comprising a reactive organic medium and a metal powder mixture, wherein said compo- sition can be applied on a substrate and heated in an oven to consolidate the composition to a solid pure metal conductor at a temperature below about 450° C.

2. The composition of claim 1 wherein said reactive organic medium is selected from the group consisting of a metallo-organic decomposition compound, a reactive compound which can react with said metal powder mixture to produce a metallo-organic decomposition compound, and mixtures thereof.

3. The composition of claim 1 wherein said reactive organic medium is comprised of one or more reactive organic compounds each having a different decomposition temperature, wherein the reactive organic medium has a decomposition temperature which is different from each of said reactive organic compounds.

4. The composition of claim 1 in which the metal powder mixture is comprised of:
   a) 0–100% by weight metal flakes having a diameter of about 5 microns and a thickness of less than 1 micrometer; and,
   b) 0–100% by weight colloidal metal particles having a diameter less than 0.1 micrometers wherein said metal particles are not significantly aggregated into larger particles.

5. The composition of claim 1 in which the metal is selected from the group consisting of copper, silver, gold, zinc, cadmium, palladium, iridium, ruthenium, osmium, rhodium, platinum, iron, cobalt, nickel, indium, tin, antimony, lead, and bismuth.

6. A method for producing solid pure metal conductors on a substrate comprising the steps of:
   A) applying a conductor precursor in a pattern on to the substrate;
   B) heating said substrate with said patterned precursor in an oven to a critical temperature less than about 450° C. for a time less than about five minutes;
   wherein said applied conductor precursor pattern is converted into a consolidated, bonded pure metal conductor
   wherein said conductor precursor is comprised of a reactive organic medium and a metal powder mixture.

7. The method of claim 6 in which said conductor precursor is applied to said substrate by a technology selected from the group consisting of: screen printing, stencil printing, gravure printing, impression printing, offset printing, lithographic printing, dispensing, doctor blading, ink jet printing, xerographic copying, and electrostatic printing.

8. The method of claim 6 in which said conductor precursor is a copper-based composition and in which the oven atmosphere is nitrogen with less than 20 parts per million by volume of oxygen.

9. The method of claim 8 in which water vapor is added to the nitrogen to the extent of approximately 5 mole percent during the period in which said conductor precursor is being heated but not before or after the heating phase.

10. The method claim 6 in which the substrate contains a polymer which is sensitive to temperatures above about 450° C.

11. The method of claim 6 in which the substrate contains a semiconductor which is sensitive to temperatures above about 450° C.

12. The method of claim 6 in which said conductor precursor is applied to metal conductors and dielectric insulators to make electrical connections between the conductors.

13. The method of claim 6 in which said conductor precursor is applied in step A) to a photoimageable dielectric material which has been patterned by photolithography to define channels which are to become conductors, whereby said channels are filled with said conductor precursor by doctor blading or printing,
   wherein upon the heating of step B) simultaneously crosslinks the dielectric material and consolidates said applied conductor precursor pattern.

14. The method of claim 6 in which said conductor precursor are applied in step A) to a continuous web of substrate material and cured in step B) as a continuous web in an oven, further comprising the step of:
   C) cutting said continuous web of substrate material into a final product.

15. The method of claim 6 in which said substrate is a semiconductor device.

* * * * *